(12) United States Patent
Baugh et al.

(10) Patent No.: US 7,117,454 B2
(45) Date of Patent: Oct. 3, 2006

(54) MOLECULAR LOGIC GATES

(75) Inventors: Richard A Baugh, Palo Alto, CA (US); Yong Chen, Sherman Oaks, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 223 days.

(21) Appl. No.: 10/693,150

(22) Filed: Oct. 23, 2003

(65) Prior Publication Data
US 2005/0091624 A1 Apr. 28, 2005

(51) Int. Cl.
*G06F 17/50* (2006.01)

(52) U.S. Cl. .............................. 716/1; 716/12; 716/16; 977/940

(58) Field of Classification Search .................... 716/1, 716/4, 8–9, 12–13; 977/762, 938, 940
See application file for complete search history.

(56) References Cited

U.S. PATENT DOCUMENTS

| | | | | |
|---|---|---|---|---|
| 5,910,898 A * | 6/1999 | Johannsen | ...................... | 716/1 |
| 6,820,244 B1 * | 11/2004 | Lincoln | ......................... | 716/4 |
| 6,895,571 B1 * | 5/2005 | Hogg | .......................... | 716/12 |

* cited by examiner

*Primary Examiner*—Paul Dinh

(57) ABSTRACT

Various nanoscale logic gates are disclosed. An alternating current ("AC") source is superimposed on a direct-current ("DC"), largely resistor-based nanoscale logic circuit in order to provide distinguishable, AC current or voltage logical output signals despite potentially narrow DC-voltage or DC-current ranges produced by the resistor-based nanoscale logic circuit. AC-enhanced AND, OR, NAND, and NOR nanoscale logic gates are provided as four specific embodiments of the present invention.

20 Claims, 29 Drawing Sheets

MOLECULAR LOGIC GATES

TECHNICAL FIELD

The present invention is related to molecular electronics and, in particular, to resistor-based nanoscale logic circuits that provide easily distinguished logic output signals in response to the logical states of an arbitrary number of logical input signal lines.

BACKGROUND OF THE INVENTION

During the past fifty years, tremendous progress has been made in electronic technologies. Large vacuum-tube-based electronic systems were replaced with smaller, more reliable transistor-based electronics, in turn replaced with integrated-circuit technologies with ever increasing component densities and switching speeds. Currently, efforts are being made to push the standard photolithographic semiconductor-fabrication process to produce ever decreasing components sizes. One approach to decreasing component sizes is to decrease the wavelength of the light used to expose photoresist in photomasking steps. Retooling current semiconductor-fabrication facilities to employ shorter wavelength, soft x-rays is projected to involve staggering capital expenditures. Moreover, various physical limits of component sizes may be soon approached. For these reasons, designers and manufacturers of electronics systems, and, in particular, manufacturers and designers of computer processors and memories, are currently seeking non-photolithographic technologies for producing denser electronic circuitry.

A new approach to circuit fabrication involves molecular electronics. Nanoscale molecular wires ("nanowires") can now be fabricated into programmable nanoscale crossbars and other structures, with molecular junctions at nanowire interconnections, comprising as few as 40 molecules, providing resistor-like, diode-like, and transistor-like nanoscale components. Efforts are currently underway to fabricate high-density logic circuits, memory elements, programmable gate arrays, and processors using these new nanoscale technologies. However, at nanoscale dimensions, precise fabrication of molecular-junction diode and transistors presents many challenges. Designers and manufacturers of nanoscale electronic circuits, including logic circuits and memories, have therefore recognized the need for basic, reliable molecular logic gates despite current difficulties in reliably fabricating nanoscale diode and transistor components.

SUMMARY OF THE INVENTION

In one embodiment of the present invention, an alternating current ("AC") source is superimposed on a direct-current ("DC"), largely resistor-based nanoscale logic circuit in order to provide distinguishable, AC current or voltage logical output signals despite potentially narrow DC-voltage or DC-current ranges produced by the resistor-based nanoscale logic circuit. AC-enhanced AND, OR, NAND, and NOR nanoscale logic gates are provided as four specific embodiments of the present invention.

DETAILED DESCRIPTION OF THE INVENTION

One embodiment of the present invention provides nanoscale logic gates that produce logical output signals with relatively wide voltage or current ranges that lead to readily electronically distinguishable ON and OFF logical output signals. Four specific embodiments, provided below, include AND, OR, NAND, and NOR nanoscale logic gates.

Figure 1A:
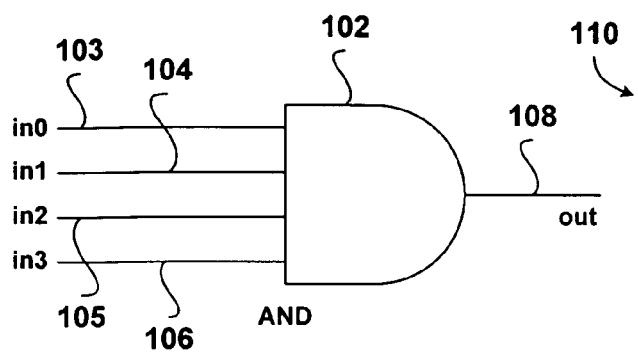
FIGS. 1A–D functionally illustrate the four, basic logic gates AND, OR, NAND and NOR.

FIGS. 1A–D functionally illustrate the four, basic logic gates AND, OR, NAND and NOR. FIG. 1A shows an AND logic gate. The AND logic gate is symbolically represented as a semi-rectangularly shaped closed figure with one rounded side 102 to which a number of signal lines 103–106 are input and from which a single output signal line 108 emerges. Each input signal line 103–106 may be in a high-voltage or high-current state, normally considered a logical ON state, or a low-voltage or low-current state, normally considered a logical OFF state. These states are alternatively represented as Boolean "1" and "0," respectively. An opposite convention may also be used.

Figure 1B:
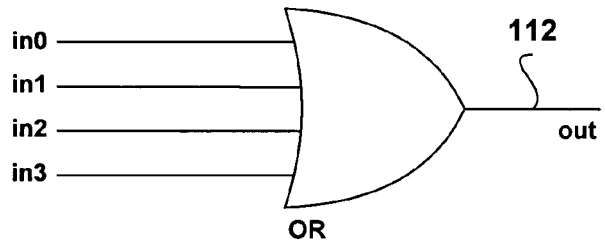
Figure 1C:
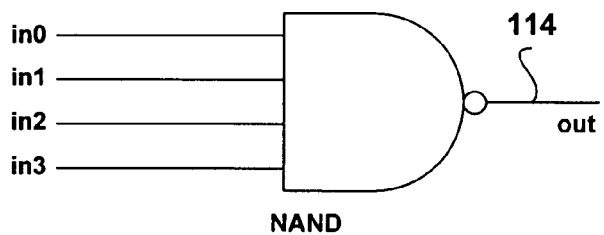
Figure 1D:
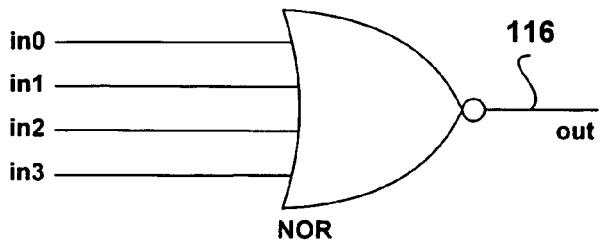

As with all logic gates, the voltage or current state of the output signal line 108 depends on the logic states of the input signal lines. The AND logical gate 102 shown in FIG. 1A has four input signal lines, but AND logical gates may have between two and an arbitrary number n input signal lines. The logical state of the output signal line 108 for each possible combined state of the input signal lines is provided in the chart 110, to the right of the symbolic representation of the AND gate in FIG. 1A. The output signal line is ON when all n input lines are also ON. FIGS. 1B–1D illustrate the OR, NAND and NOR logical gates using the same illustration conventions as used for FIG. 1A. The output signal line of an OR logical gate 112 is OFF only when all n input lines are OFF. The output signal line 114 of a NAND logical gate is OFF only when all n input signal lines are ON. The output signal line 116 of a NOR logical gate 116 is ON only when all n input signal lines are OFF.

Figure 2:
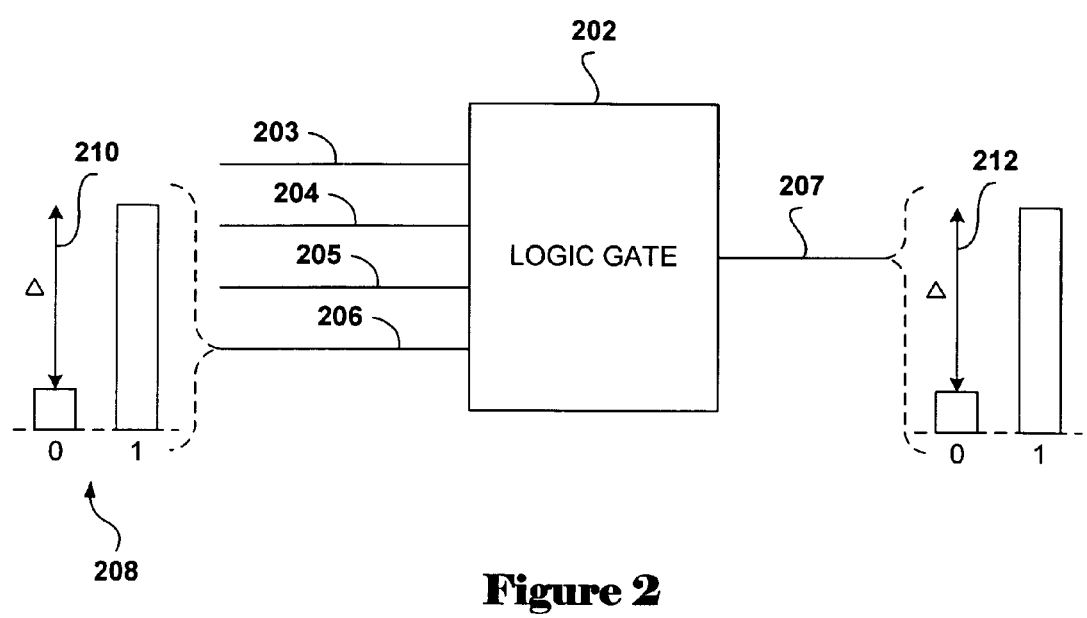
FIG. 2 illustrates a desirable, wide-signal-range property of a generalized logic gate.

FIG. 2 illustrates a desirable, wide-signal-range property of a generalized logic gate. In FIG. 2, a general logic gate 202 receives four input signal lines 203–206 and produces a single output signal line 207. The input signal lines 203–206 are each in either a high-voltage or high-current ON state, or in a low-voltage or low-current OFF state, as represented by the bar-graph-like chart 208 to the left of the generalized logic gate. It is desirable that the difference $\Delta$ 210 between the 0 and 1 states is relatively large, so that 0 and 1 logic states can be unambiguously electronically distinguished. Similarly, the output signal line 207 may also be either in an ON or OFF state, with well-separated voltage or current differences 212 between the 0 and 1 states. As with a manufactured article, components and subcomponents of logic gates cannot be manufactured with precise dimensions, material composition, and physical characteristics, but instead exhibit ranges of physical characteristics within certain design and manufacturing tolerances. Therefore, the 0 and 1 voltage or current states of input signals to a logic gate exhibit a more or less continuous range of current or voltage distributed about the ideal 0 current or voltage and the ideal 1 current or voltages. As the difference $\Delta$ between the voltage or current representing logical 0 and 1 decreases, the potential ambiguity of the combined state of the input signals may increase. If logic gates, in turn, produce output signals with narrowed voltage or current ranges, the ambiguity may be amplified through propagation within a logic circuit comprising many tens, hundreds, thousands, or millions of logic gates. Therefore, a large $\Delta$ is desirable, both in input signal lines and in output signal lines. More particularly, the output-signal-line $\Delta$ of a logic gate should be at least as large as that of any input signal line.

Figure 3A:
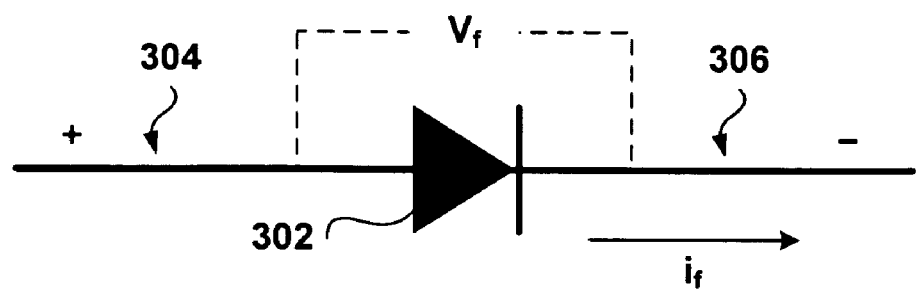
FIG. 3 illustrates a rectifying diode.
Figure 3B:
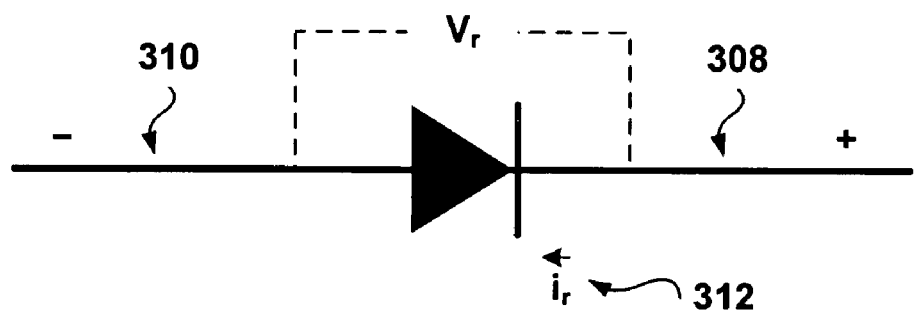

FIG. 3 illustrates a rectifying diode. A rectifying diode is represented by a filled triangle and a vertical line symbol 302. Diodes are commonly used as rectifying components that pass DC current in only one direction. When a diode is forward biased, as shown in FIG. 3A, with a higher voltage on the anode side of the diode 304 then on the cathode side of the diode 306, there is a forward voltage drop $V_f$ across the diode, and the diode passes a forward current $i_f$ in the direction of the forward voltage bias. Conversely, when the diode is reversed biased, as shown in FIG. 3D, with a higher voltage on the cathode 308 side of the diode than on the anode 310 side of the diode, there is a potential drop $V_r$ across the diode essentially equal to the applied reverse biasing voltage. When reversed biased below a breakdown threshold, the diode passes only a tiny 312 reverse current $i_r$. The diode thus serves as a one-way gate, passing substantial current only in one direction. When forward biased, as shown in FIG. 3A, the diode is in a low impedance state, as a result of a narrowed depletion region within the pn junction forming diode, thus allowing the diode to pass a relatively small AC signal superimposed on the forward biasing DC current in either the forward or reverse directions. However, when the diode is reversed biases, as shown in FIG. 3B, the depletion region within the pn junction of a diode is broadened, resulting in a high-impedance state that blocks propagation of a relatively small AC signal superimposed on the reverse biasing DC current in either direction.

Figure 4A:
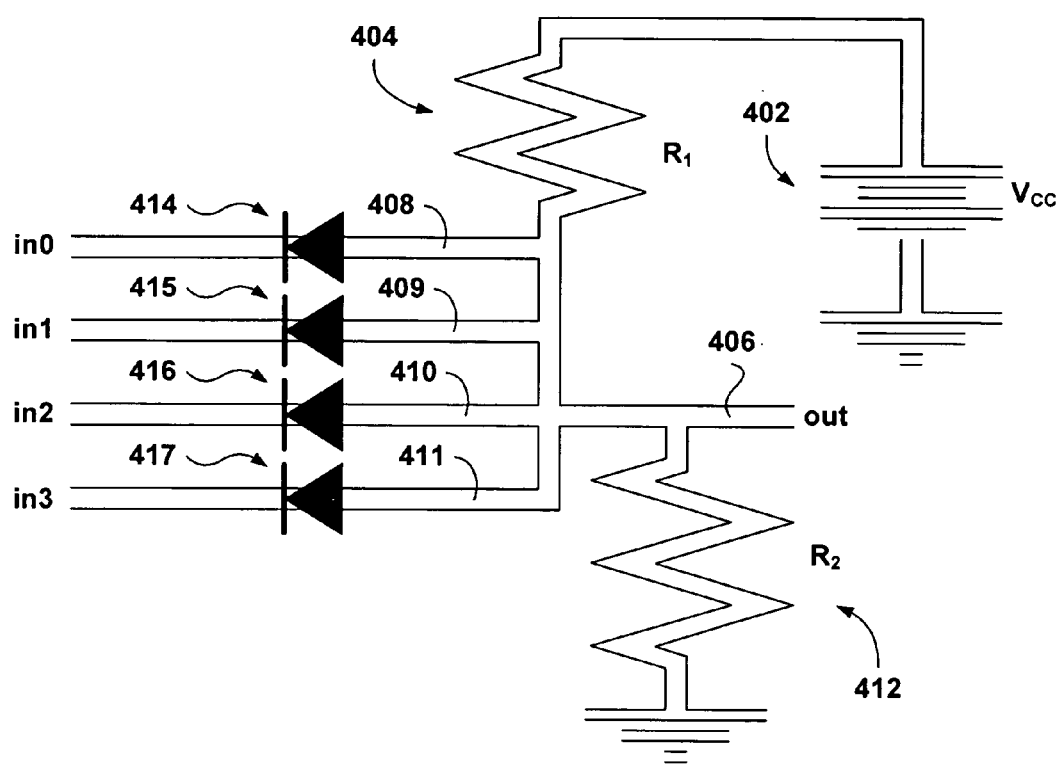
FIGS. 4A–D illustrate an example AND logic gate with four input signals lines that would be desirable to fashion at the molecular level.
Figure 4B:
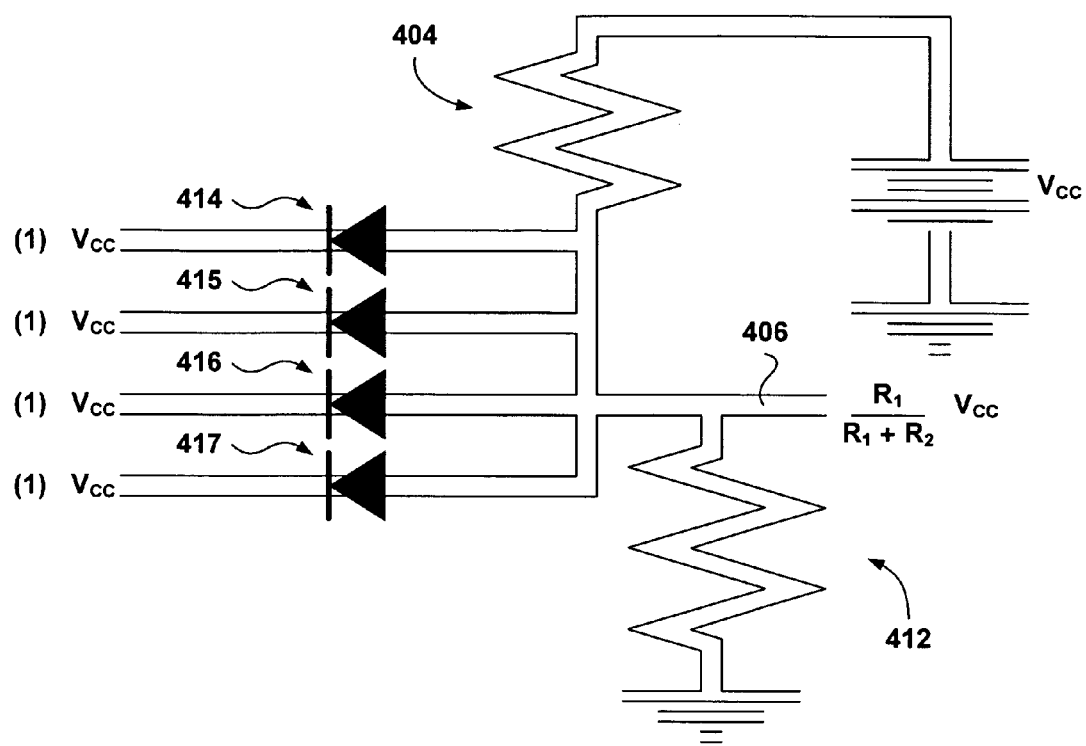
Figure 4C:
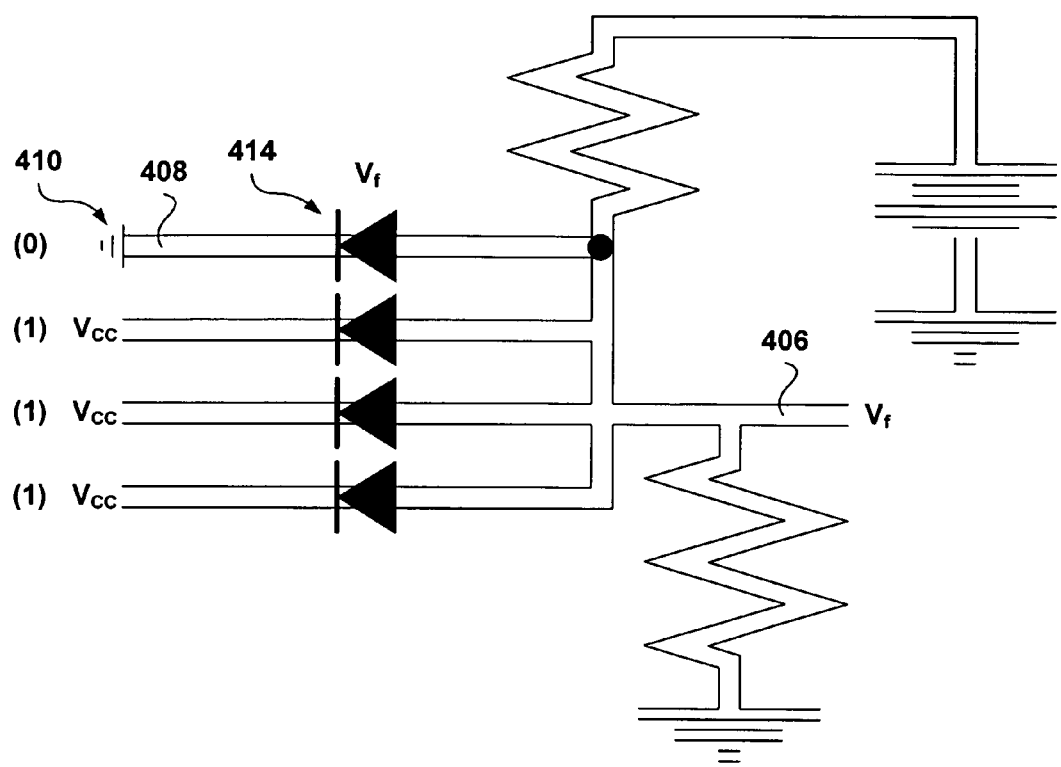
Figure 4D:
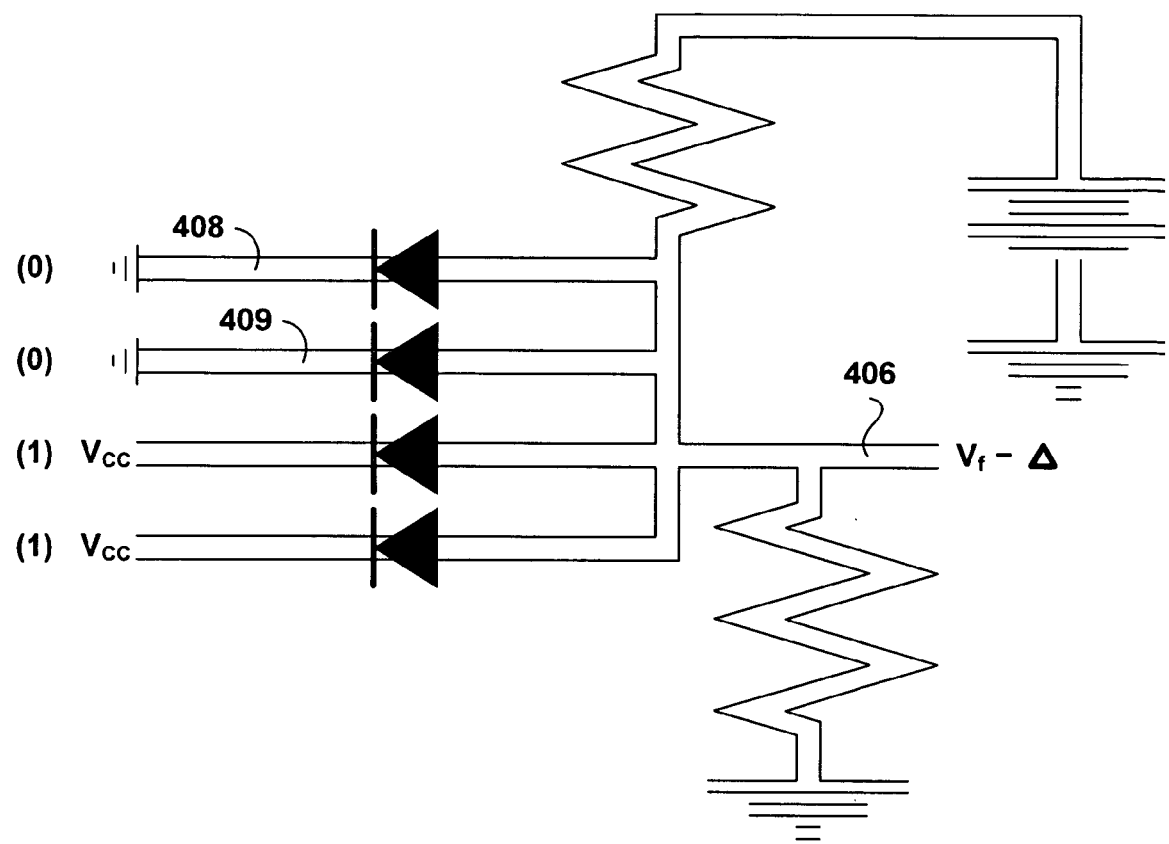

FIGS. 4A–D illustrate an example AND logic gate with four input signals lines that would be desirable to fashion at the molecular level. In FIG. 4A, a voltage source 402, which provides the ON logic-state voltage $V_{CC}$, is coupled to a first resistive element 404 with resistance $R_1$, in turn coupled to the output signal line 406 and the four input signal lines 408–411, and to ground through a second resistive element 412 with resistance $R_2$. Each of the four input lines 408–411 are gated with diodes 414–417. When all four input signals are ON, at the relatively high voltage $V_{CC}$, as shown in FIG. 4B, none of the four diodes 414–417 are forward biased, and therefore the output signal line 406 has the voltage level $$\frac{R_1}{R_1 + R_2} V_{CC}$$

which approaches $V_{CC}$ when the resistance $R_2$ of resistive element 412 is significantly less than the resistance $R_1$ of resistive element 404. However, as shown in FIG. 4C, when any one input signal line is in a low-voltage state, then the diode gating that signal line becomes forward biased and essentially shorts the output signal line to the low-voltage state. In the example shown in FIG. 4C, the first input signal line 408 is shown to be grounded 410, thereby forward biasing diode 414, with a voltage drop across diode 414 of $V_f$. Therefore, the output signal line 406 is at a relative potential $V_f$. Generally, the voltage drop across a forward-bias diode is quite small in comparison with a driving voltage $V_{CC}$, and consequentially the potential $V_f$ represents a low-voltage, OFF state. FIG. 4D shows both the first and second input lines 408 and 409 in OFF states, with the relative potential of the output signal line 406 equal to $V_f - \Delta$, where $\Delta$ is a small positive additional voltage drop resulting from the second forward-biased diode.

Figure 5A:
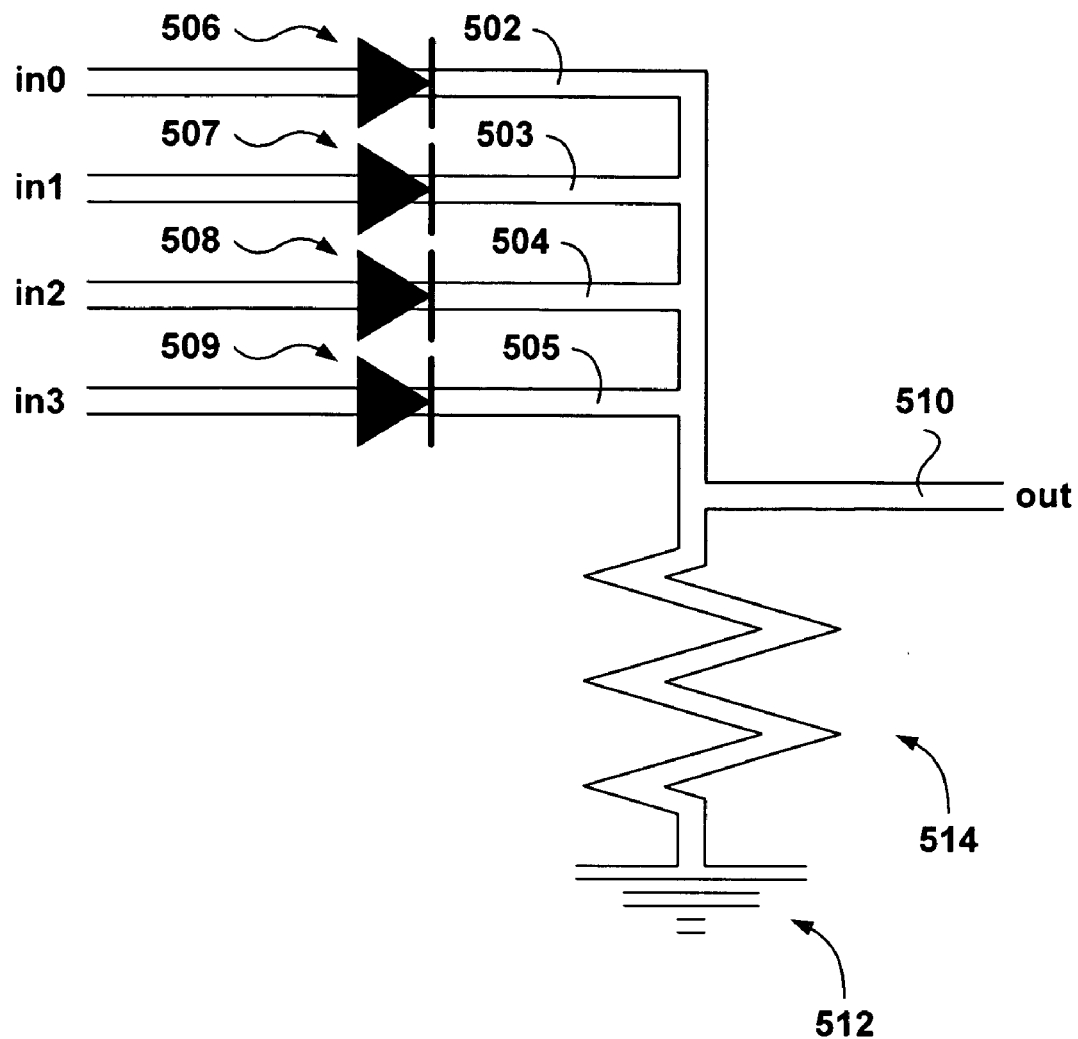
FIGS. 5A–D illustrate, in a fashion similar to FIGS. 4A–D, implementation of a diode-based OR gate.
Figure 5B:
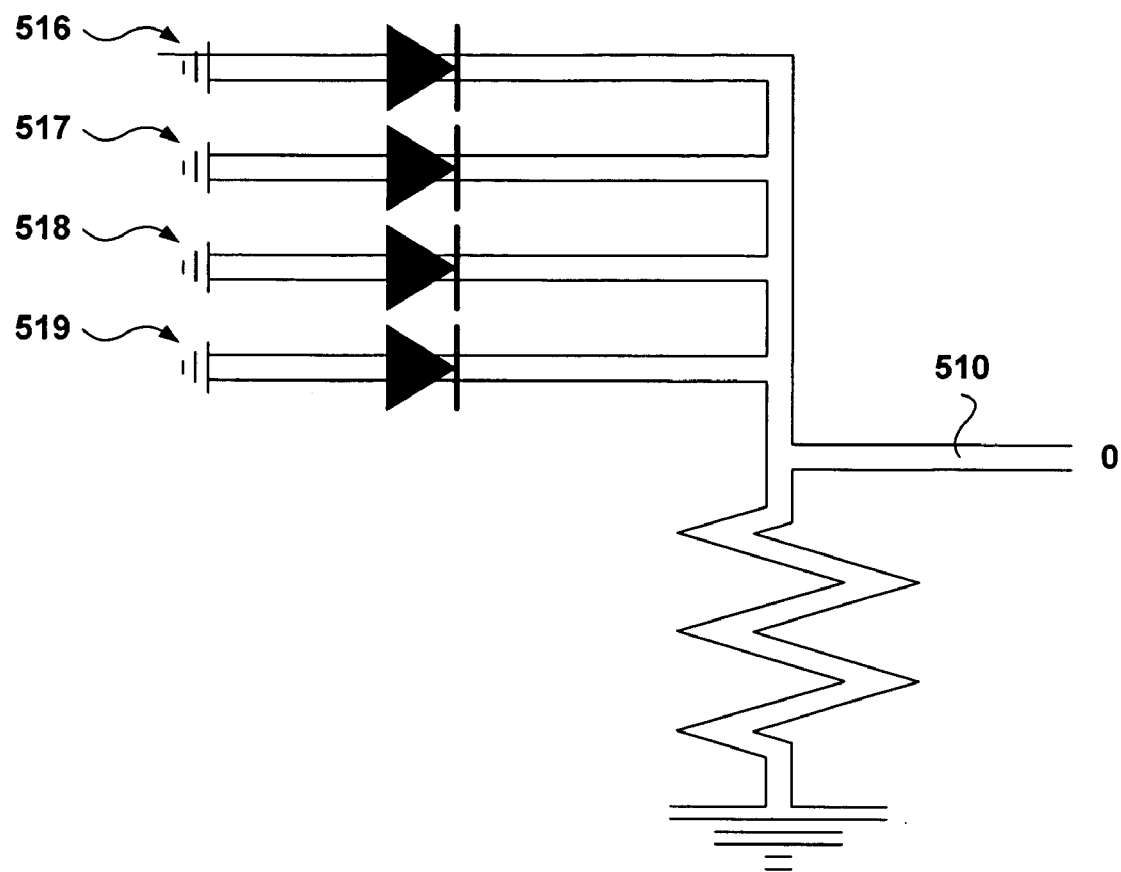
Figure 5C:
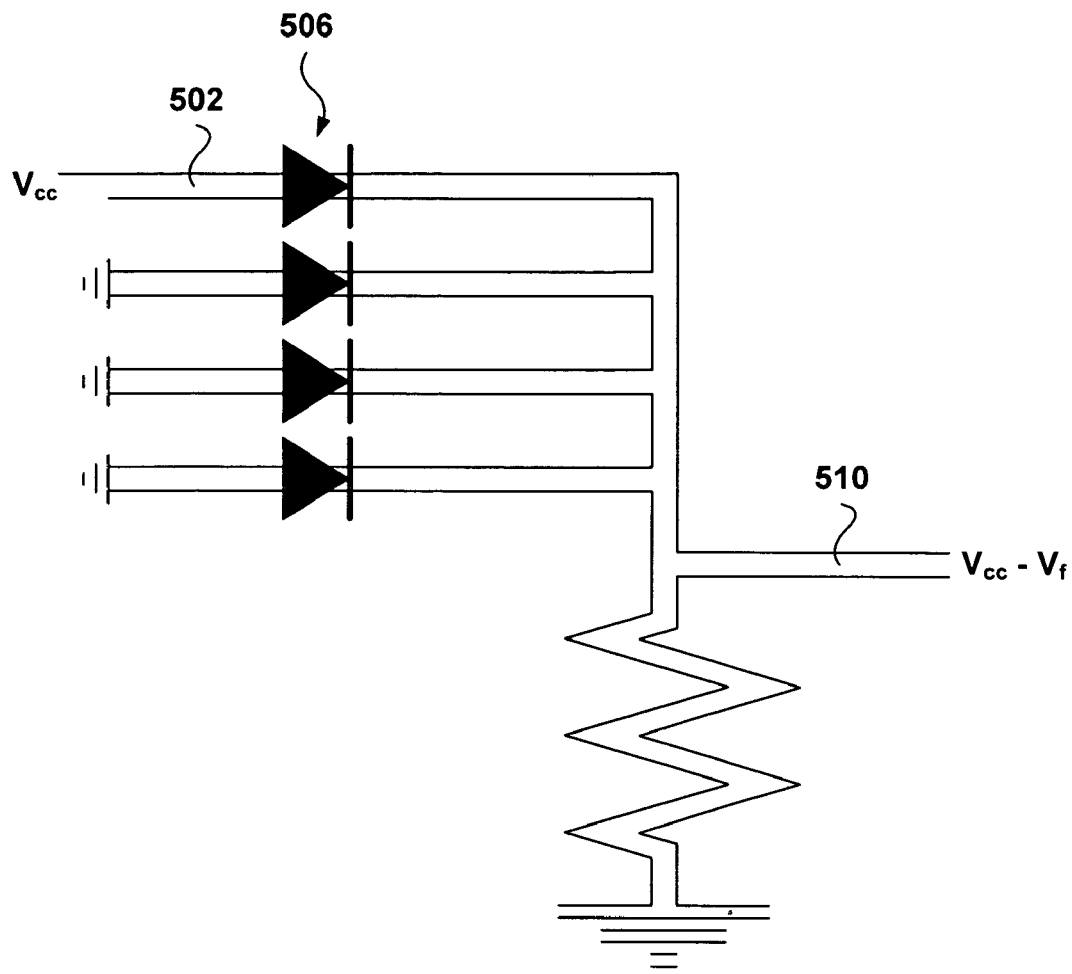
Figure 5D:
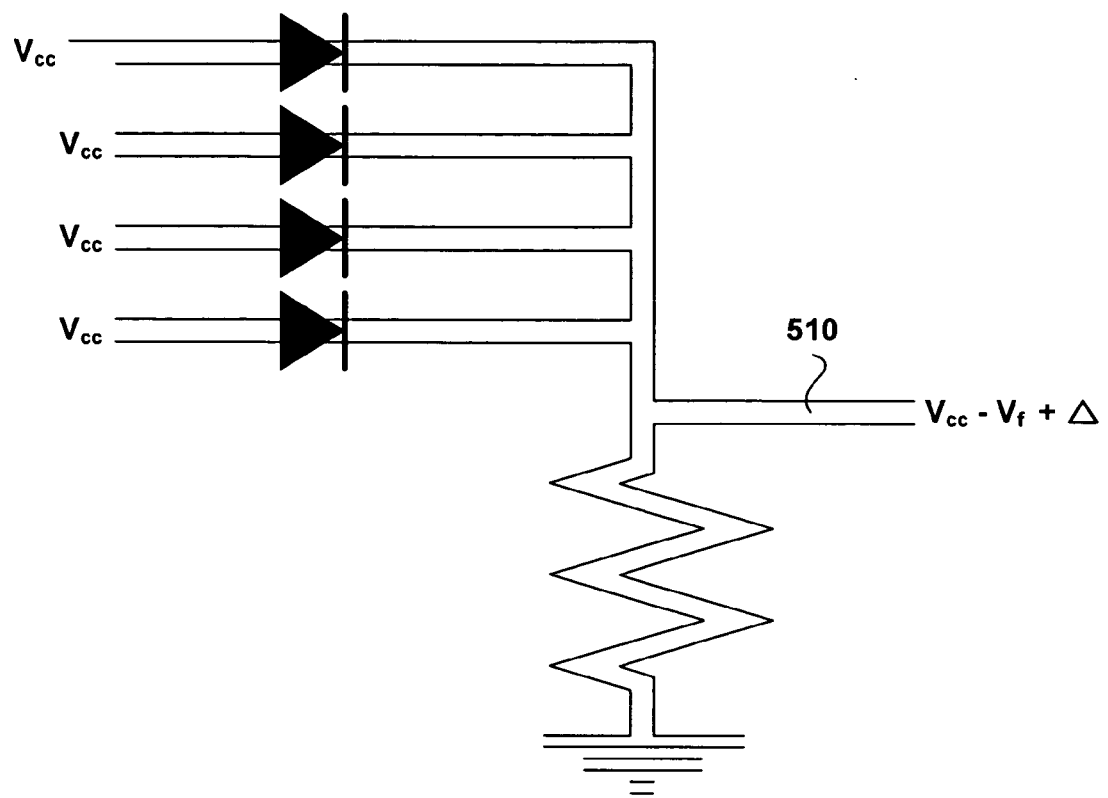

The AND logical gate implementation illustrated in FIGS. 4A–D is an example of a logic gate with easily distinguished output logical states, as discussed above with reference to FIG. 2. FIGS. 5A–D illustrate, in a fashion similar to FIGS. 4A–D, implementation of a diode-based OR gate. The OR gate includes four input signals lines 502–505, each gated with a diode 506–509, and each interconnected with the output signal line 510 and to ground 512 through a resistive element 514. As shown in FIG. 5B, when all four input signal lines are in the OFF logical state, or, in other words, interconnected with ground 516–519, then the output signal line 510 has a voltage potential of 0. However, as shown in FIG. 5C, when a single input signal line, for example input signal line 502, has the logical state ON, or, in other words, has the relatively high voltage potential $V_{CC}$, then the diode gating the signal line 506 is forward biased, and passes, to the output signal line 510, the high voltage state $V_{CC}$ with a small voltage drop due to the diode 506. In the case that all four input signal lines are ON, as shown in FIG. 5D, then the output signal line 510 has the voltage potential $V_{CC} - V_f + \Delta$, where $\Delta$ is a relatively small positive adjustment. Thus, again, the diode-based logic circuit provides output voltage states that are easily distinguished, since the voltage range is essentially 0 to $V_{CC}$.

Both the example AND and OR logic gates described above with references to FIGS. 4A–5D have only four input signal lines, each of which are gated with diode elements. As discussed above, these relatively simple implementations provide the wide voltage ranges needed for easily distinguishing ON and OFF states on the output signal line produced by the logic gates. However, there are several problems that prevent current use of these simple diode-based implementations at nanoscale dimensions. First, while diode-like molecular junctions can currently be fabricated, these diode-like molecular junctions may not have sufficient functional yield and sufficient reliability to provide for feasible commercialization. A second, contributing factor is that, in general, logic gates may need to support a large number of input signal lines n, where n is much greater than four. Due to the difficultly in producing nanoscale diode elements, a nanowire-crossbar-type logic gate with n input signals can currently be manufactured only with very low yields and reliability, due to the multiplicative decrease in yield due to the individual defect and failure probabilities associated with single diode-like molecular junctions. However, it is currently feasible to manufacture reliable resistive molecular junctions at the molecular level. Thus, resistor-based logic gates are potentially commercially feasible. However, the logical state of output signal lines emerging from resistor-based logic gates may not be easily distinguished.

Figure 6A:
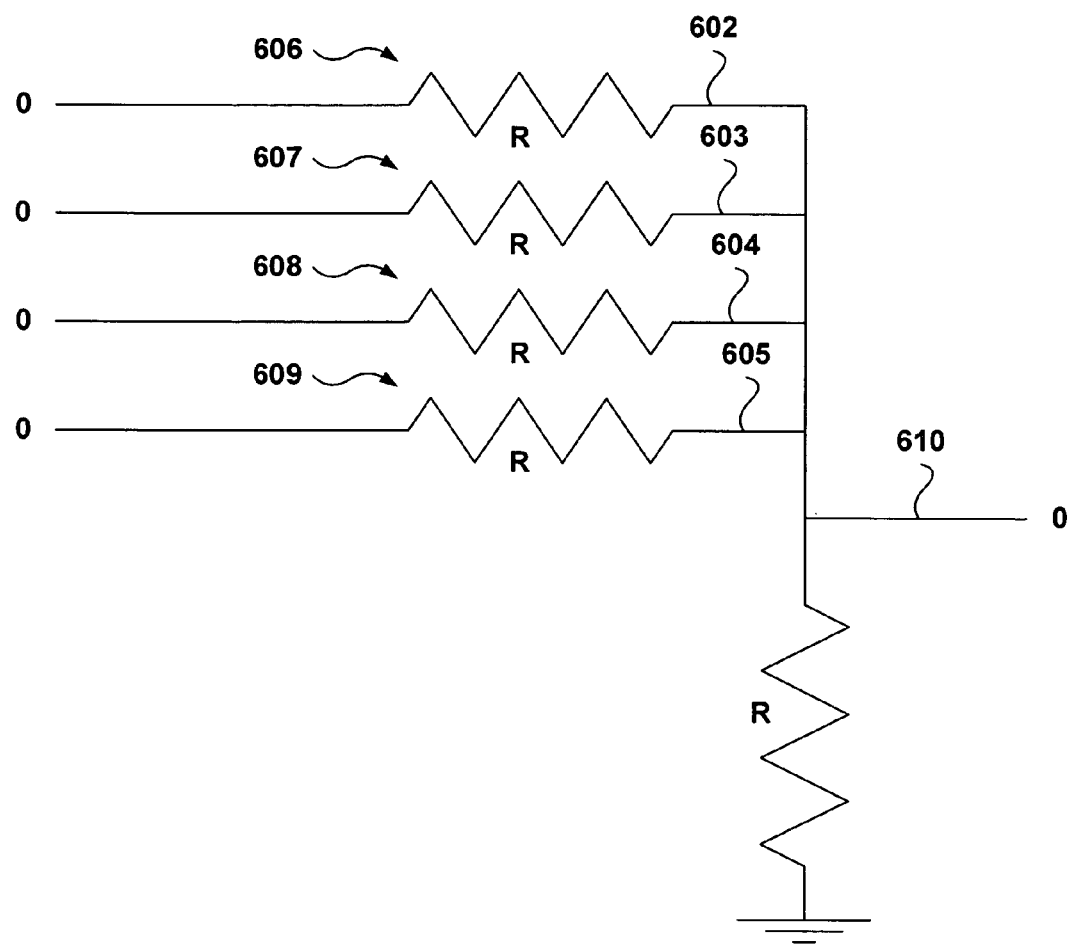
FIGS. 6A–D illustrate operation of a resistor-based OR logic gate.
Figure 6B:
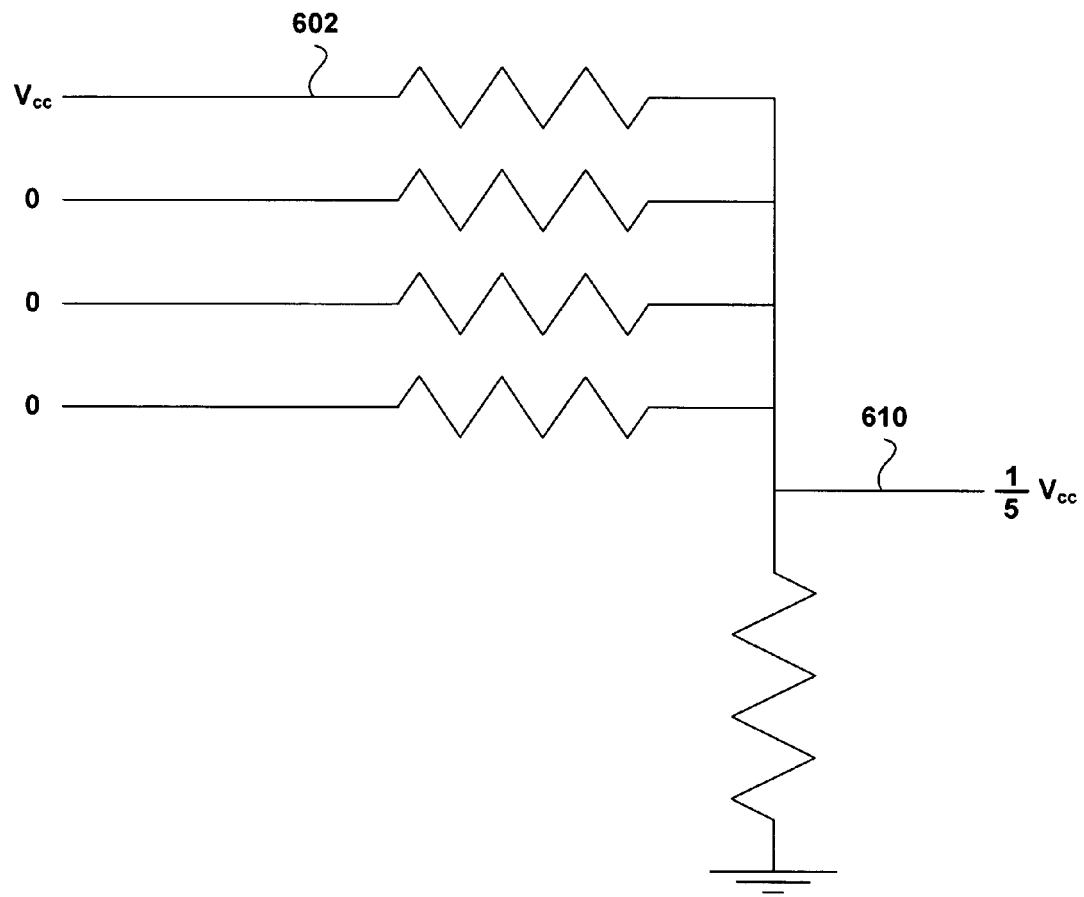

FIGS. 6A–D illustrate operation of a resistor-based OR logic gate. This logic gate is similar to the OR logic gate described above, with reference to FIGS. 5A–D, with the exception that each of the four input signal lines 602–605 include resistive elements 606–609 rather than the diode elements included in the diode-based implementation shown in FIGS. 5A–D. As shown in FIG. 6A, when all four input signal lines are OFF, the output signal line 610 is also OFF. As shown in FIG. 6B, when a single input signal line, for example, signal line 602, is ON, at a voltage of $V_{CC}$, then the output signal line 610 is at the relative voltage $$\frac{1}{5} V_{CC}.$$

Figure 6C:
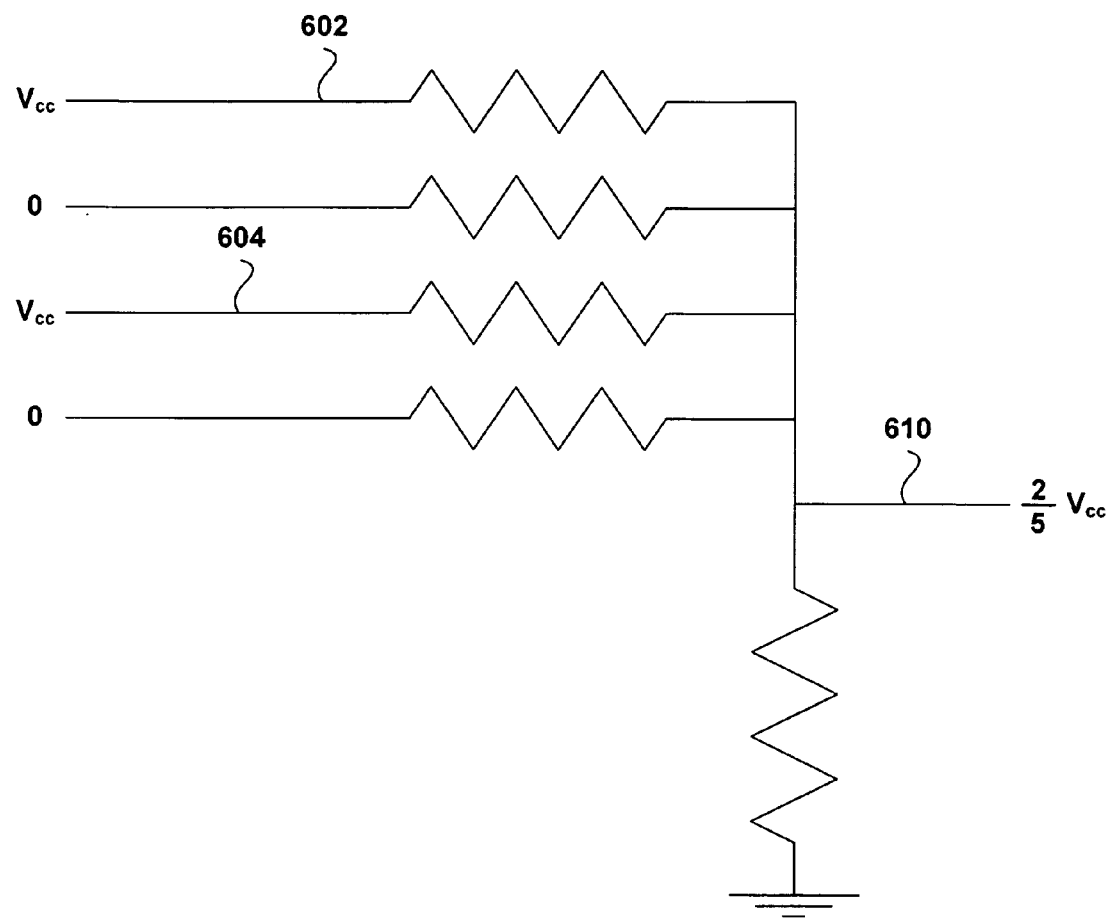

As shown in FIG. 6C, when two input signal lines 602 and 604 are ON, the output signal line is at the relative voltage $$\frac{2}{5} V_{CC}.$$

Figure 6D:
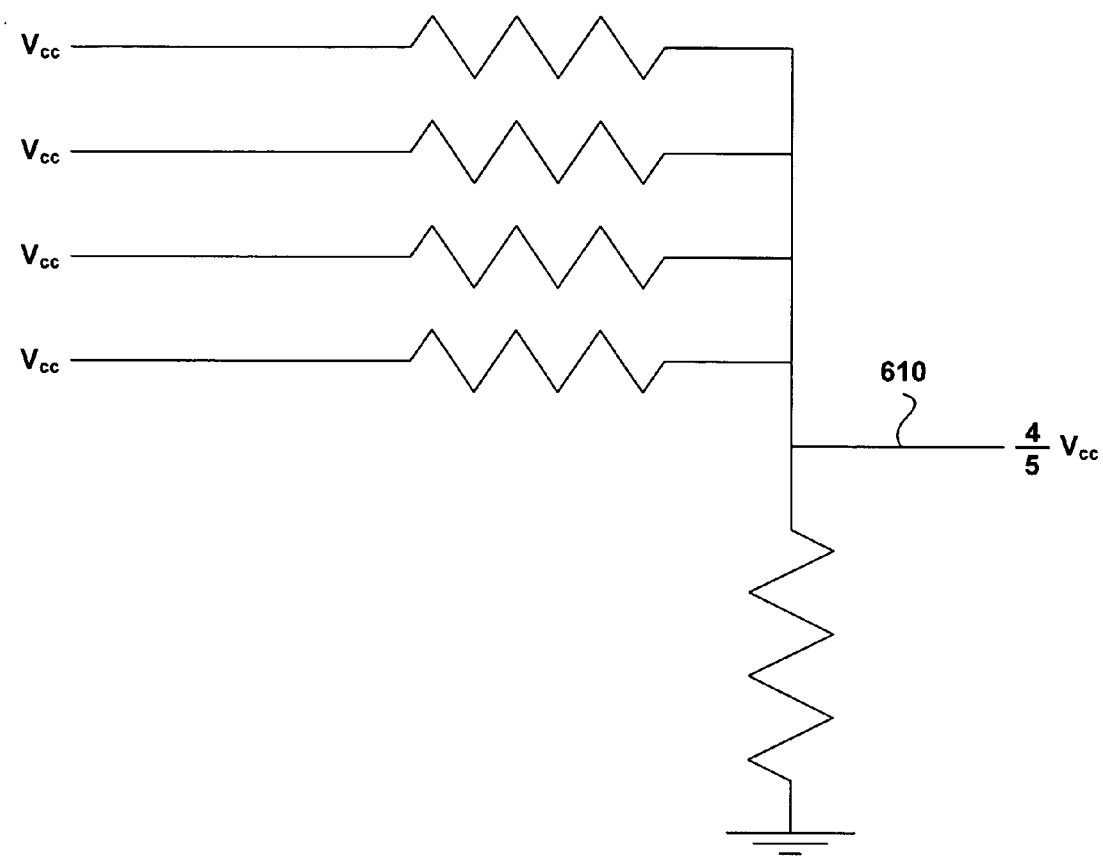

Finally, as shown in FIG. 6D, when all four input signal lines are ON, the output signal line is at the relative voltage $$\frac{4}{5} V_{CC}.$$

Thus, in the resistor-based implementation, the voltage ranges between 0 and $$\frac{4}{5} V_{CC},$$

and is relatively evenly distributed through that range depending on a number of input signal lines that are ON. In the case shown in FIGS. 6A–D, the output-signal-line voltage 0 represents logical OFF, and the output-signal-line voltage $$\frac{1}{5} V_{CC},$$

and all higher output-signal-line voltages, represent the logical state ON. The resistor-based implementation has a voltage range of $$\frac{1}{5} V_{CC},$$

and has therefore decreased the voltage difference between the ON and OFF states by nearly $$\frac{4}{5} V_{CC}.$$

Figure 7:
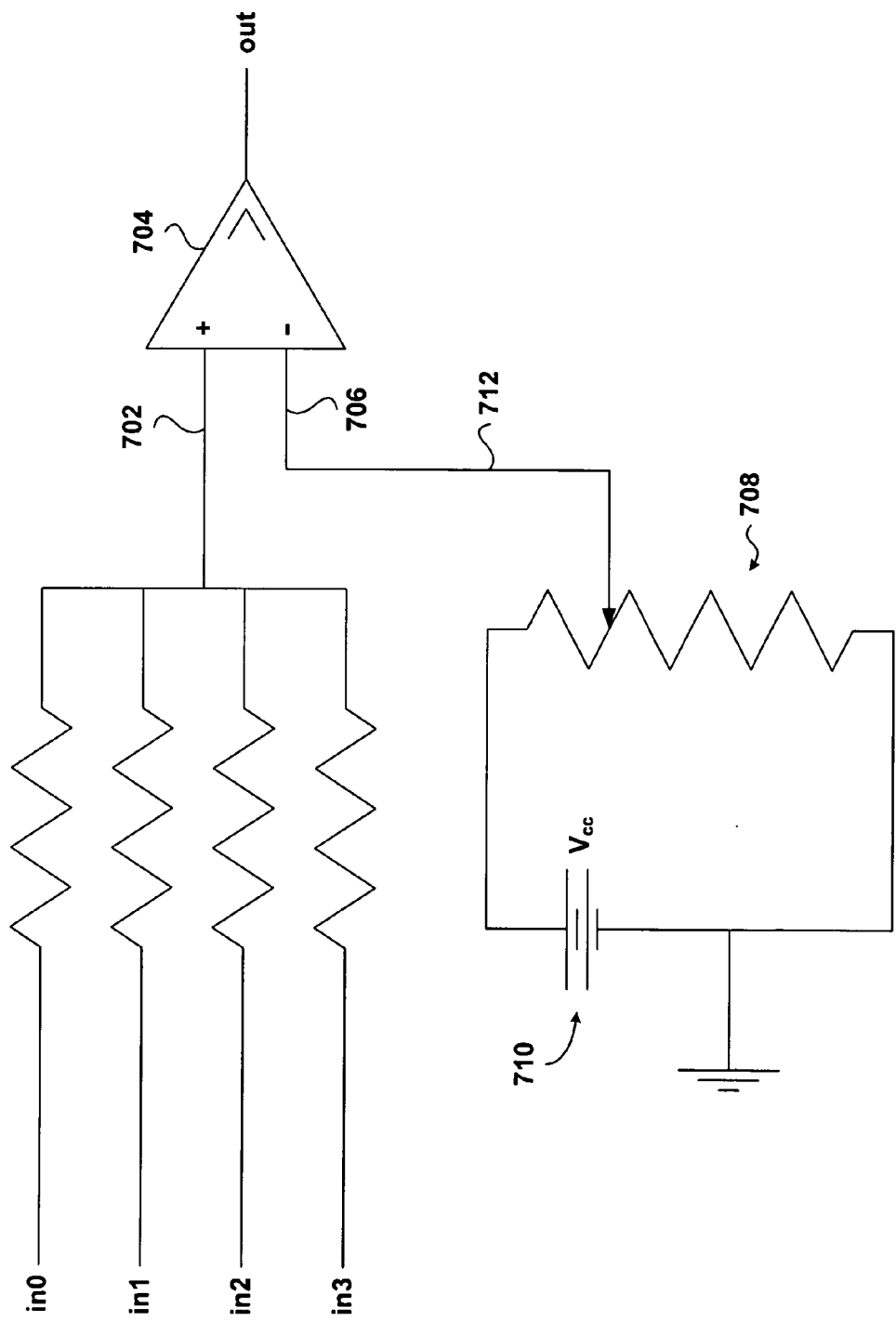
FIG. 7 illustrates an enhancement to the OR-logic-gate implementation shown in FIGS. 6A–D that provides a distinguishable output-signal-line voltage state.

FIG. 7 illustrates an enhancement to the OR-logic-gate implementation shown in FIGS. 6A–D that provides a distinguishable output-signal-line voltage state. As shown in FIG. 7, the four input signal lines are connected to one input 702 of a comparator 704, and the other input of the comparator 706 is interconnected to a variable-resistance subcircuit including a resistor 708 and a voltage source 710. The variable-resistance subcircuit allows the second input signal line 712 connected to the second input 706 of the comparator 704 to be placed precisely at a threshold voltage. The comparator 704 outputs ON when the voltage at the first input 702 is equal to or greater than the voltage at the second input 706, and otherwise outputs OFF. Thus, setting input signal line 712 to a constant voltage of $$\frac{1}{10} V_{CC}$$

allows the enhanced circuit to function as an OR logic gate, and setting the input signal line to the second input 706 of the comparator 704 to the constant voltage of $$\frac{7}{10} V_{CC}$$

allows the enhanced logic gate shown in FIG. 7 to function as an AND logic gate. Note that the threshold voltage input to the second input 706 of the comparator 704 is set to a voltage value intermediate between the two voltage states output from the resistor-based logic gate that correspond to ON and OFF voltage states.

Figure 8:
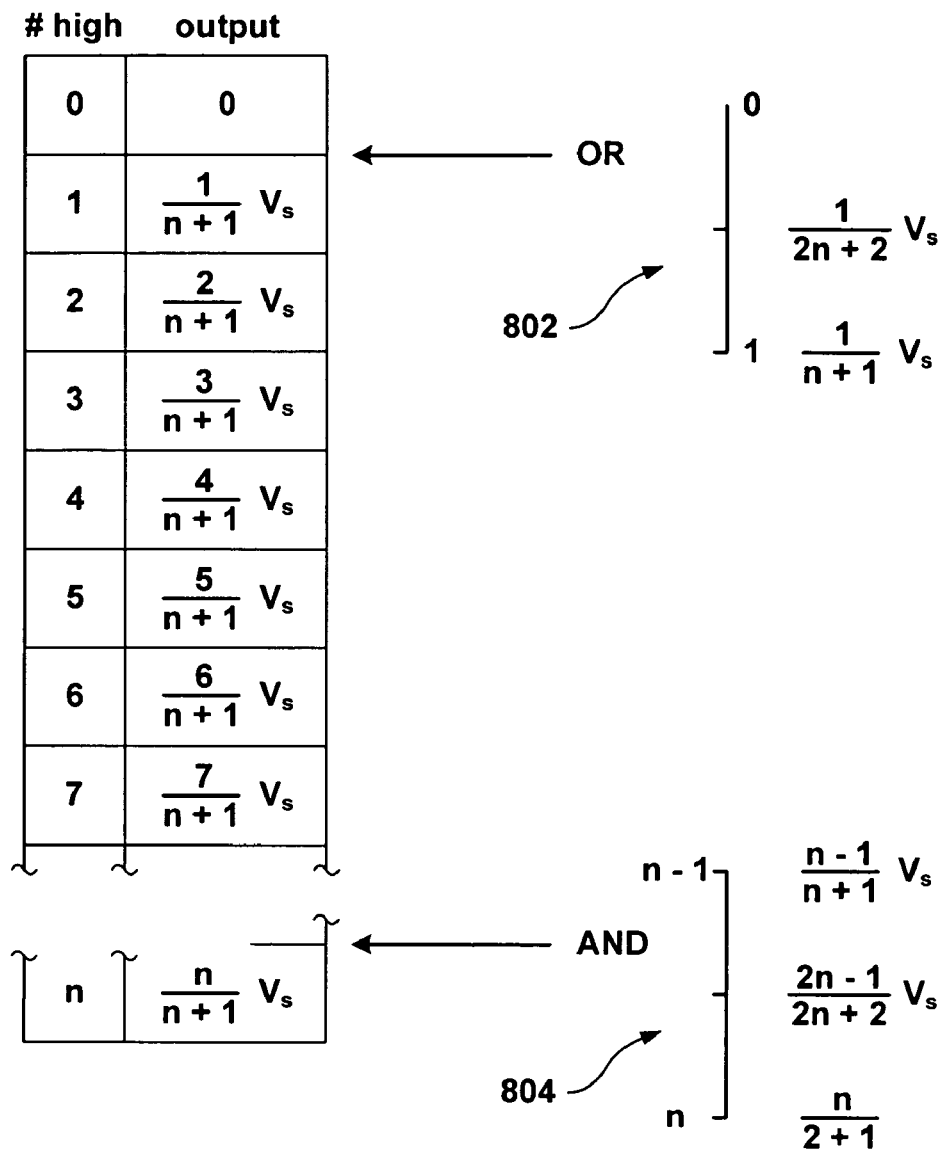
FIG. 8 illustrates the threshold, second-input-signal-line voltages needed for the enhanced implementation of the logic gate shown in FIG. 7 in order to produce OR and AND logic gates.

FIG. 8 illustrates the threshold, second-input-signal-line voltages needed for the enhanced implementation of the logic gate shown in FIG. 7 in order to produce OR and AND logic gates. In FIG. 8, the output-signal-line voltage state corresponding to the number of signal lines that are in the ON state is shown for the case of n signal lines input to the logic gate. Therefore, the voltage separation between n−1 and n input signal lines in the ON state is $$\frac{1}{n+1}V_s,$$

where $V_s$ is the source voltage. Therefore, to produce an OR logic gate, the threshold voltage is set midway between voltage levels 0 and $$\frac{1}{n+1}V_s, \text{ or } \frac{1}{2n+2}V_s$$

802. In order to produce an AND logic gate, the threshold voltage is placed intermediate between the voltage state for n−1 input signal lines in the ON state and n signal lines in the ON state, or $$\frac{2n-1}{2n+2}V_s$$

804. As is evident from FIG. 8, the ability to distinguish the ON and OFF states of the resistor-based logic gate decreases with an increasing number of input signal lines. Because the voltages of the input signal lines cannot be precise, but fall in a distribution around 0 and $V_s$ there is a limit, even in the enhanced logic gate shown in FIG. 7, to the number of input signal lines that can be accommodated by the logic gate without producing a voltage separation between output logical states that is too narrow.

Figure 9A:
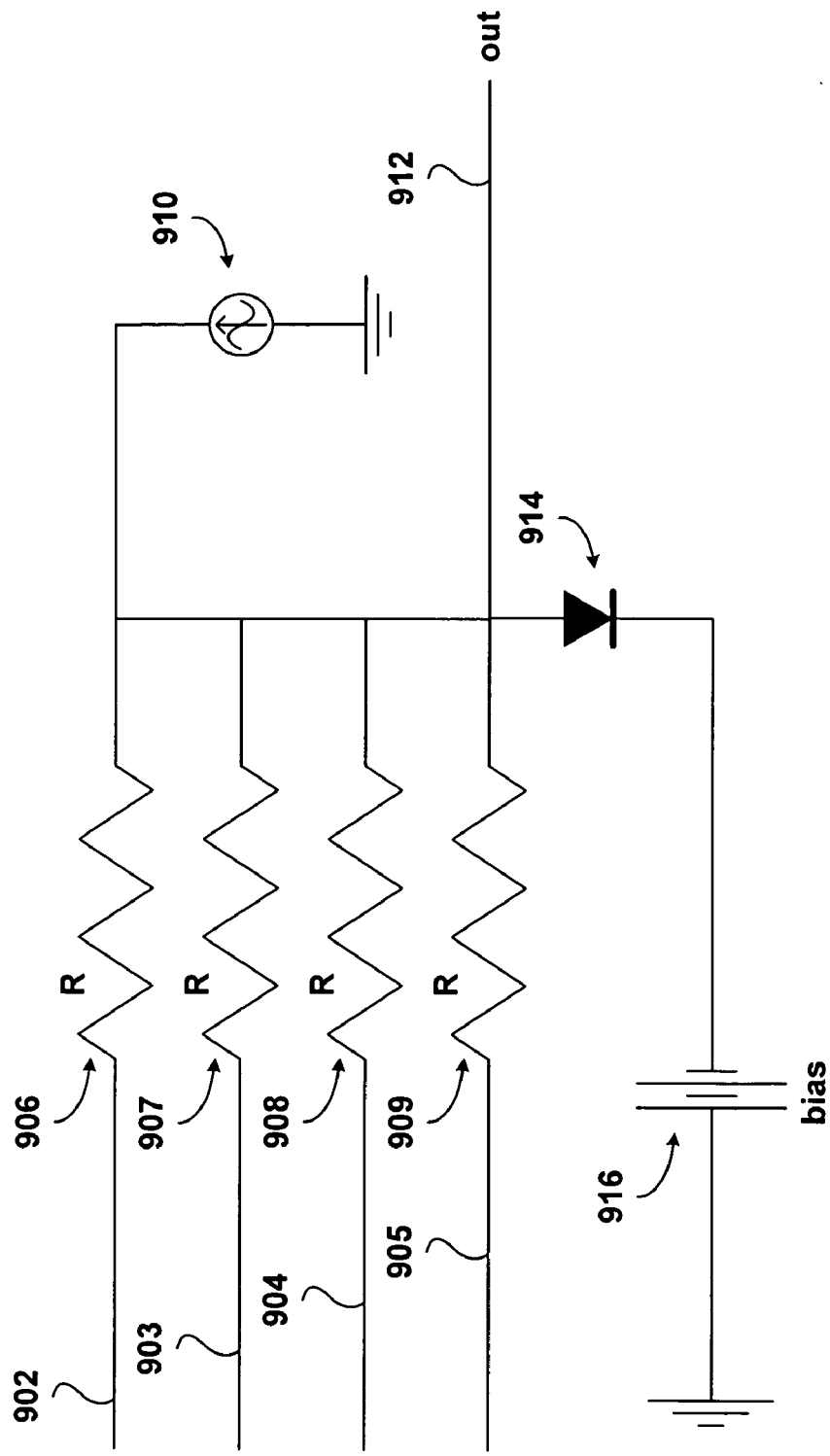
FIG. 9A illustrates an AC-enhanced, nanoscale NOR logic gate that represents one embodiment of the present invention.

FIG. 9A illustrates an AC-enhanced, nanoscale NOR logic gate that represents one embodiment of the present invention. In the AC-enhanced, nanoscale NOR logic gate, four input signal lines 902–905 are interconnected, through resistor-like elements 906–909, to an alternating current input source 910, the output signal line 912, and a diode-like element 914 slightly forward biased by a biasing DC voltage source 916. Note that the terms "diode-like" and "resistor-like" indicate that the elements are nanoscale analogs to microscale and macroscale diodes and resistors, but not necessarily having all characteristics similar to the larger scale analogs. In certain embodiments, the diode-like element may be a larger-than-nanoscale element interconnected with numerous nanoscale logic gates. The AC-enhanced logic gate produces AC current or voltage logical states on the output signal lines, superimposed over a DC current or voltage signal, depending on whether voltage or current signals are employed in the logic circuit in which the AC-enhanced, nanoscale NOR logic gate is included. In general, the logical states of the DC input signal lines 902–905 determine whether or not the diode 914 is fully forward biased. The AC current or voltage logical output signal superimposed on a DC output signal may be converted to either a pure AC logical signal or, more commonly, to a DC logical signal via an AC-to-DC signal converter.

Figure 9B:
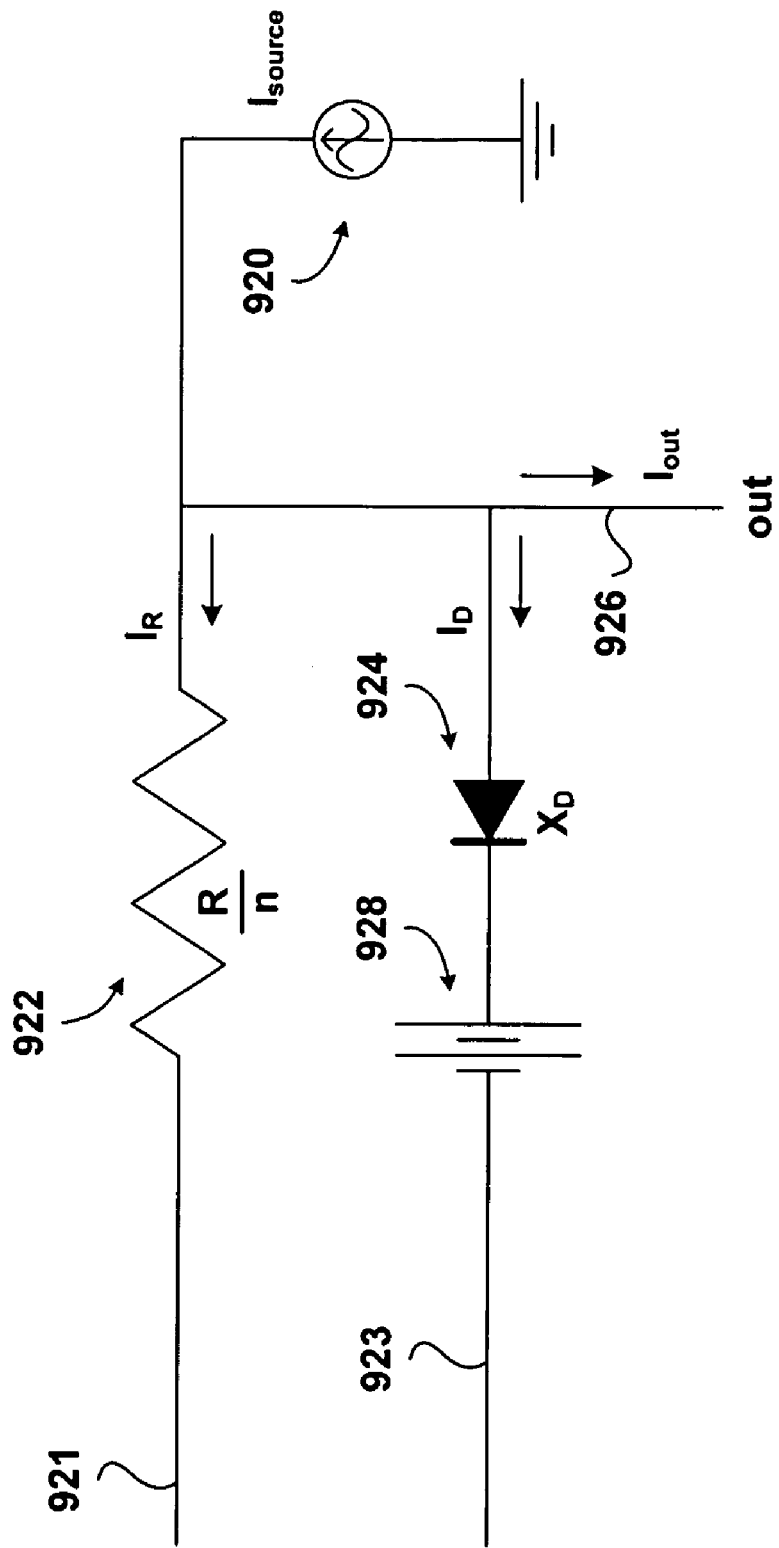
FIG. 9B illustrates the general principle of operation of the AC-enhanced, nanoscale NOR logic gate shown in FIG. 9A, and of other AC-enhanced, nanoscale logic gates shown in subsequent figures.

FIG. 9B illustrates the general principle of operation of the AC-enhanced, nanoscale NOR logic gate shown in FIG. 9A, and of other AC-enhanced, nanoscale logic gates shown in subsequent figures. An AC-enhanced logic gate, at a simplified, conceptual level, comprises an AC current source 920, a first signal line 921 connected to a resistor 922 with resistance $$\frac{R}{n},$$

where n is the number of input signal lines, in parallel with a second signal line 923 connecting a diode 924 whose incremental conductance depends on the DC bias, and an output signal line 926. The diode is generally slightly forward biased by a DC biasing source 928. The diode may have low impedance $Z_{low}$ and high impedance $Z_{high}$ states, with the impedance changing from $Z_{low}$ to $Z_{high}$ as the voltage rises above a threshold voltage $V_{thresh}$. Table 1, below, shows the impedance states of the diode produced by various levels and polarities of biasing:

TABLE 1

| bias voltage | Z |
| --- | --- |
| reverse (bias < 0) | $Z_{high}$ |
| 0 | $Z_{high}$ |
| slightly forward (0 < bias < $V_{thresh}$) | $Z_{high}$ |
| fully forward (bias > $V_{thresh}$) | $Z_{low}$ |

The first and second signal lines carry DC current and voltage, with the resulting polarity and magnitude of the voltage difference between the anode and cathode sides of the diode determining the impedance of the diode. The AC current on the output signal line $I_{out}$ is:

$$I_{out} = I_{source} - I_{\frac{R}{n}} - I_D$$

$$= I_{source} - \frac{nV_{source}}{R} - V_{source}g_D$$

where $g_D$ is the incremental conductance of the diode.

In general, the impedance of a resistor connecting an input signal line to the AC-enhanced logic gate is relatively large. When the diode is in a high-impedance state, both of the latter two negative terms are relatively small, and the output current $I_{out}$ is close to $I_{source}$ provided that n is not too large. When the diode is in a low impedance state, the output current $I_{out}$ is small, and approaches 0. Therefore, the DC voltage states of the first and second signal lines determine whether or not the diode is fully forward biased, and therefore whether the AC output signal is close to $I_{source}$, or ON, or close to 0, or OFF.

Figure 10A:
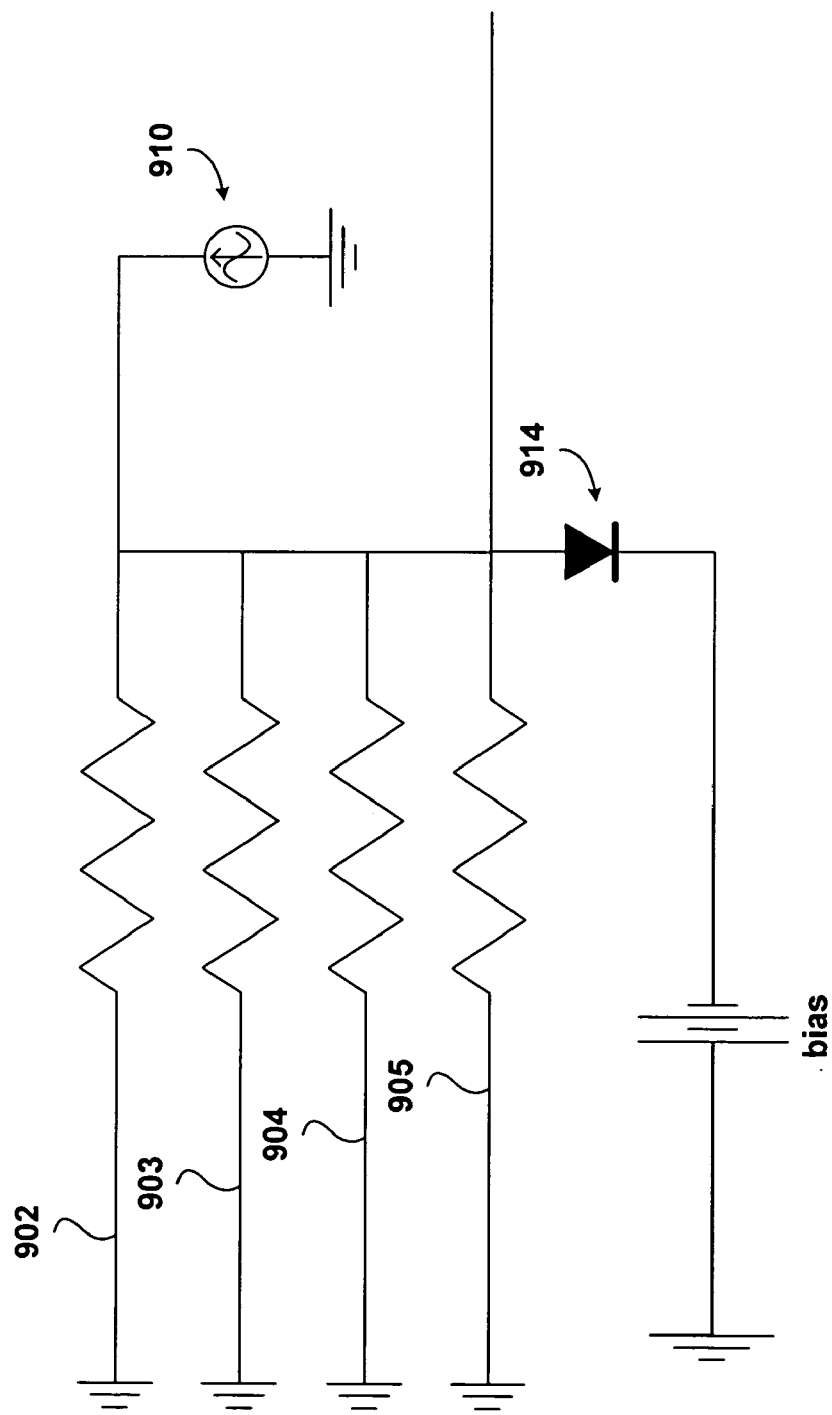
FIGS. 10A–C illustrate operation of the AC-enhanced, nanoscale logic gate shown in FIG. 9.
Figure 10B:
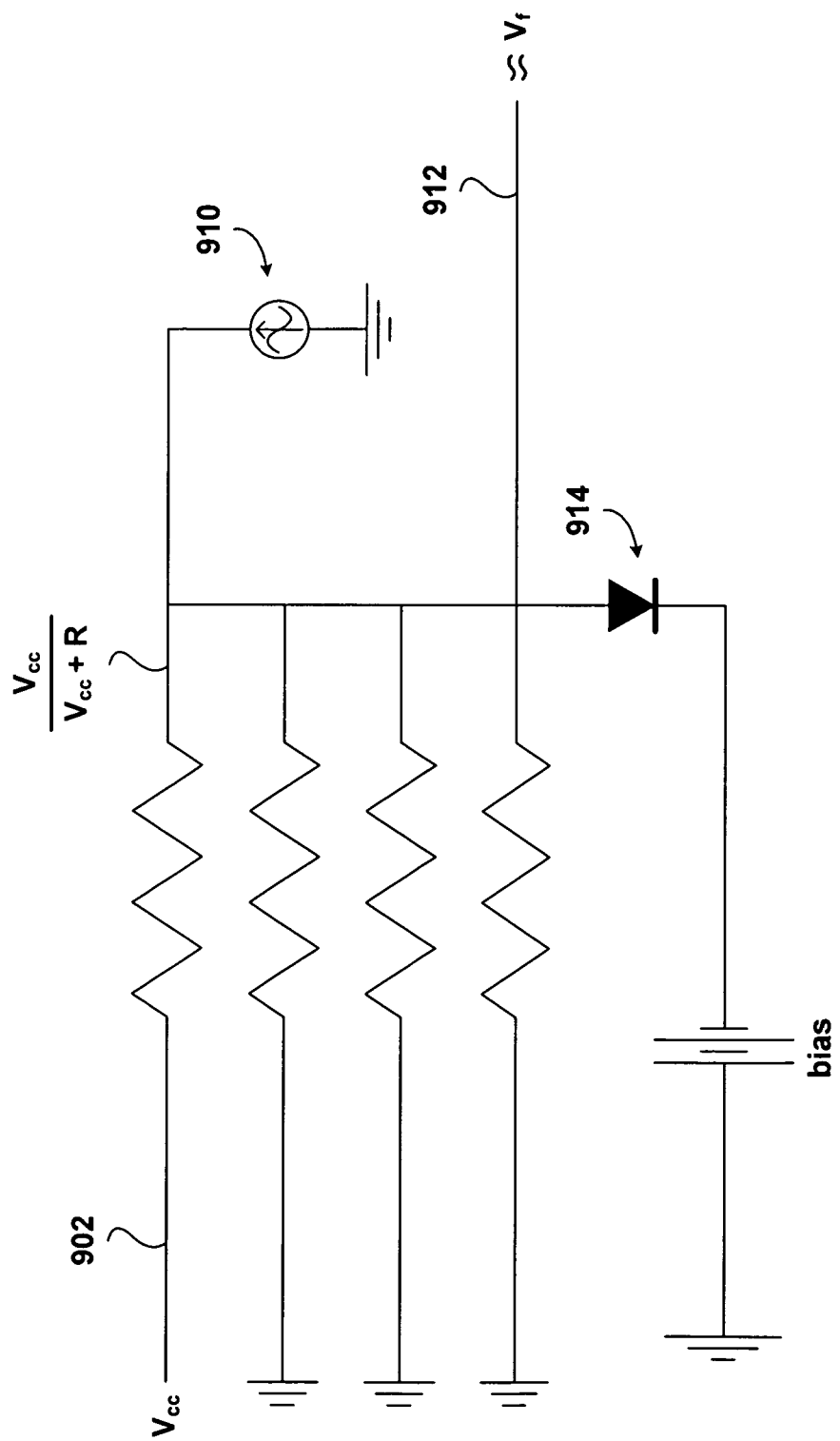
Figure 10C:
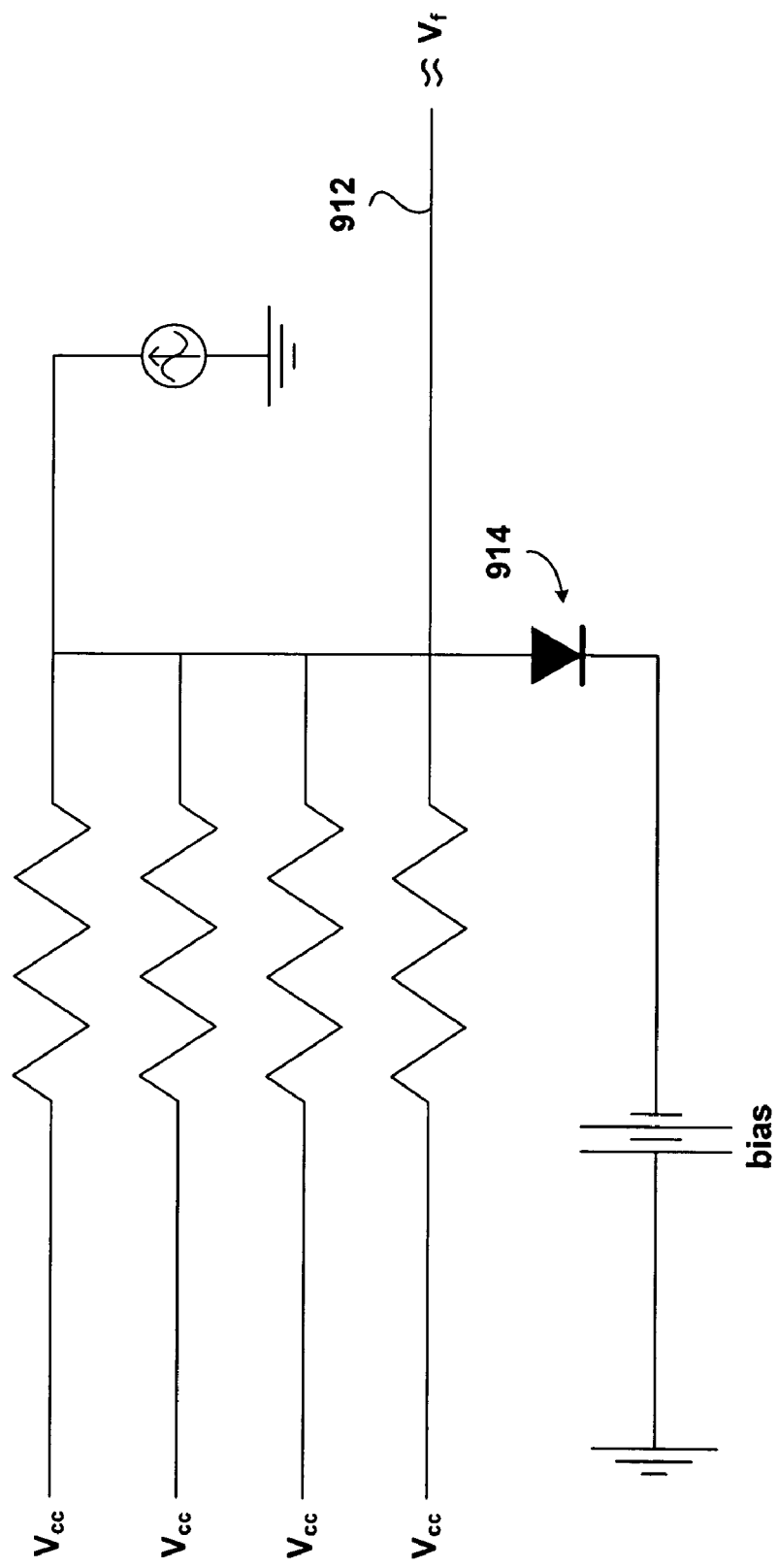

FIGS. 10A–D illustrate operation of the AC-enhanced, nanoscale logic gate shown in FIG. 9. In FIG. 10A, all four input signal lines 902–905 are in the OFF logical state, essentially at a DC voltage of 0, and therefore the diode 914 is not forward biased, and presents high impedance to the AC source 910. As a result, output signal line carries a relatively high AC signal, or, in other words, is in the ON logical state. In FIG. 10B, the first input signal line 902 is ON, with an input DC voltage of $V_{cc}$. The diode 914 is therefore forward biased, and presents low impedance to the AC source 910. The AC signal on the output signal line 912 is, as a result, relatively low, or, in another words, the output signal line is in the OFF logical state. Similarly, as shown in FIG. 10C, when all input signal lines are ON, the output signal line remains in the OFF logical state.

Figure 11:
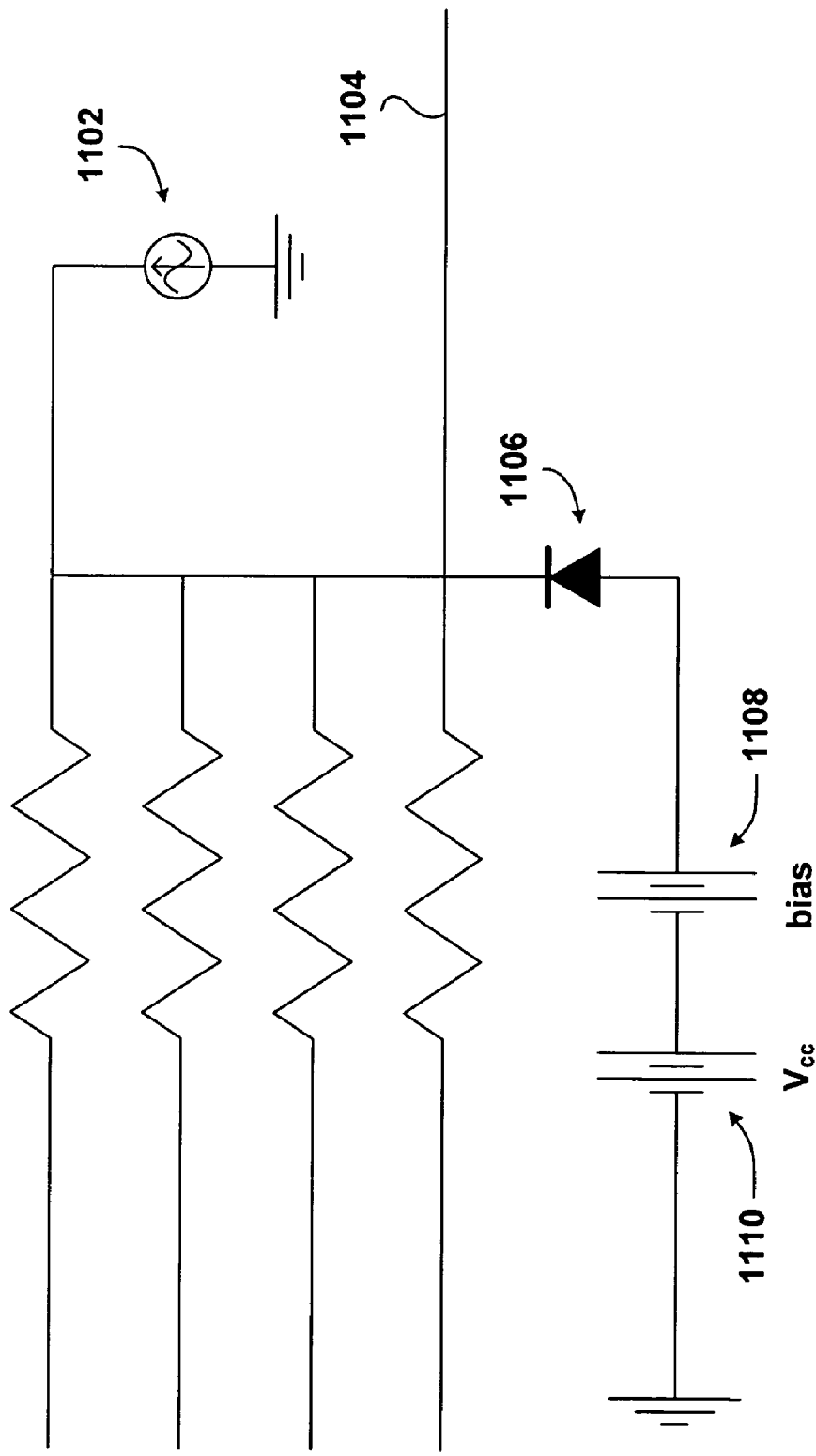
FIG. 11 shows an AC-enhanced, nanoscale AND logic gate implementation that represents one embodiment of the present invention.
Figure 12A:
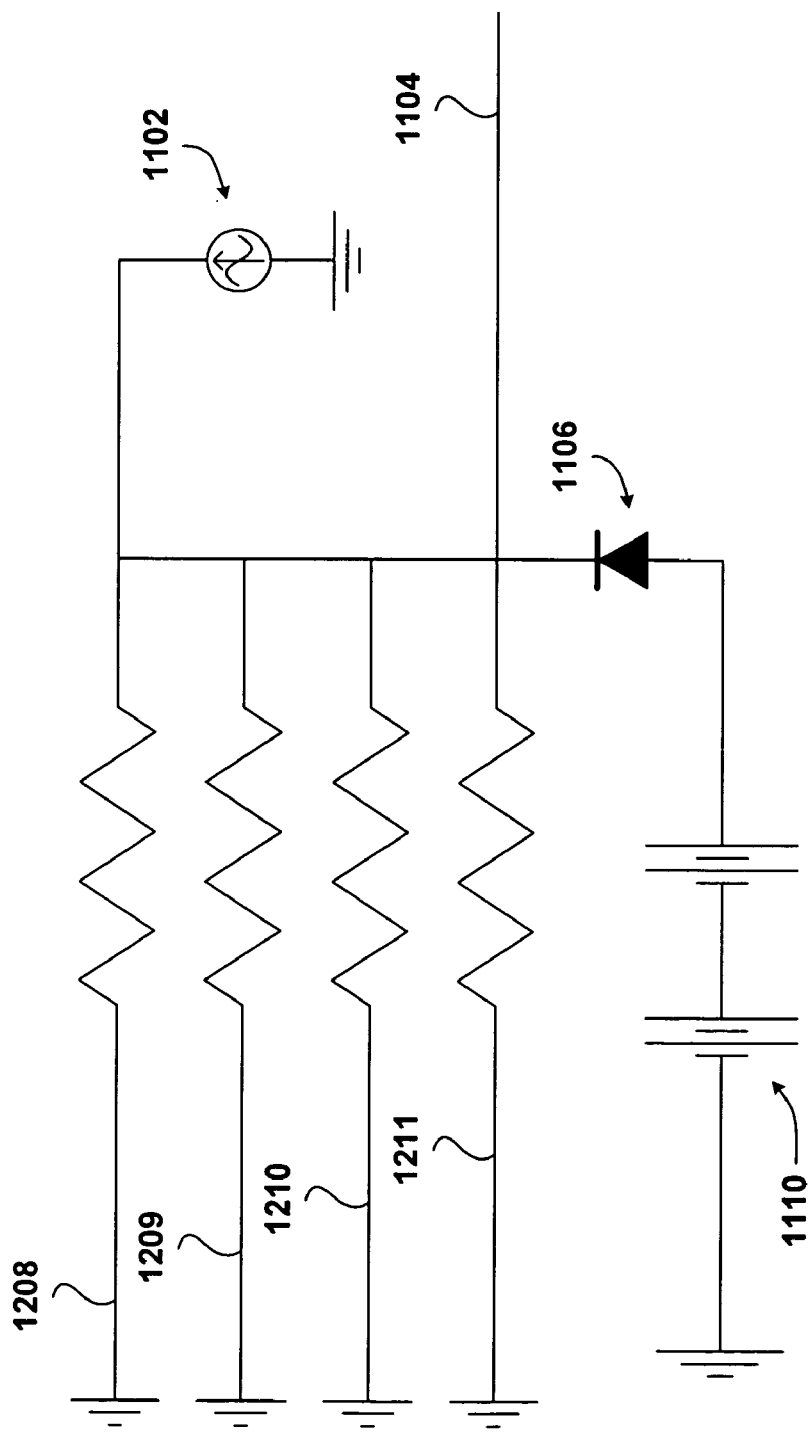
FIGS. 12A–C illustrate operation of the AC-enhanced, nanoscale AND logic gate shown in FIG. 11.
Figure 12B:
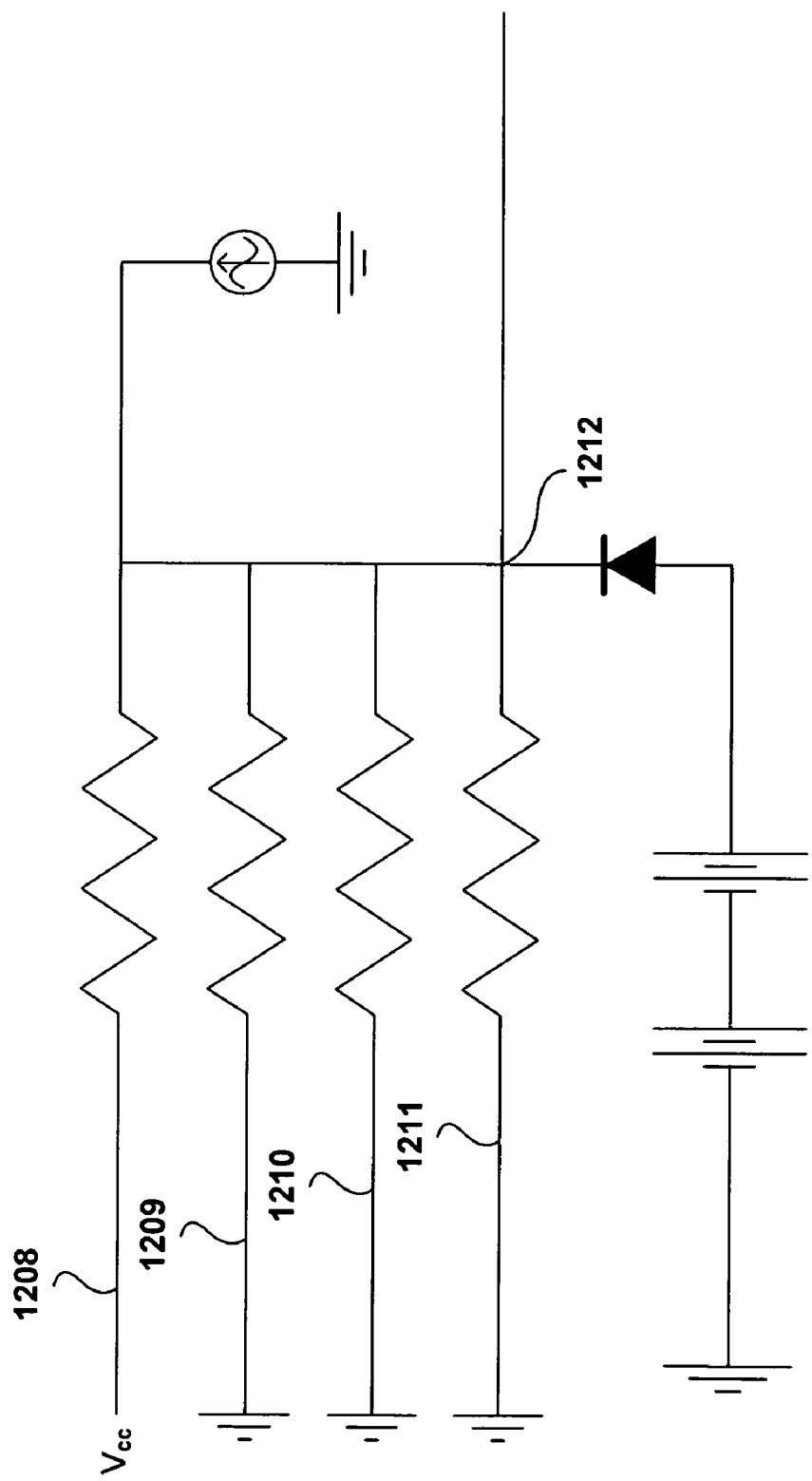
Figure 12C:
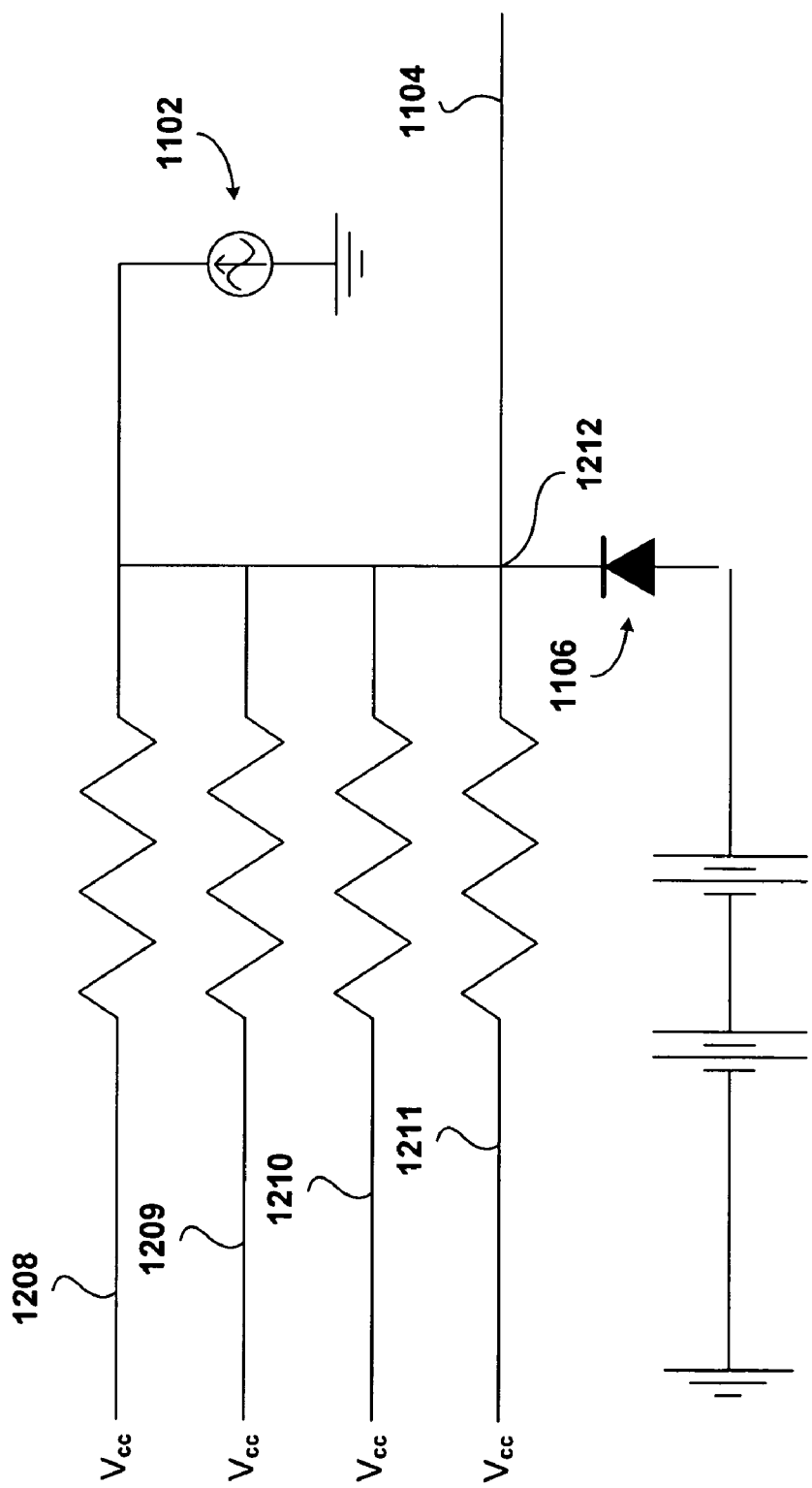

FIG. 11 shows an AC-enhanced, nanoscale AND logic gate implementation that represents one embodiment of the present invention. In FIG. 11, the AC voltage source 1102 produces a voltage or current signal that is either shunted to the output signal line 1104 or essentially shorted to ground through the diode 1106, depending on whether or not the diode is forward biaed to the low impedance state. The diode 1106 is slightly forward biased by the biasing DC source 1108 and fully forward biased by the additional, much larger, DC source 1110. FIGS. 12A–C illustrate operation of the AC-enhanced, nanoscale AND logic gate shown in FIG. 11. In FIG. 12A, all four input signal lines 1208–1211 are OFF. Therefore, the diode 1106 is fully forward biased, presenting low impedance to the AC signal source 1102. The AC source is essentially shorted to ground, leaving the output signal line 1104 in an OFF AC logical state. As shown in FIG. 12B, when the first input signal line 1208 is ON, and the remaining input signal lines 1209–1211 are OFF, the voltage at node 1212 is substantially less than $V_{CC}$, since input signal line 1208 is essentially shorted to ground through input signal lines 1209–1211. As shown in FIG. 12C, only when all four input signal lines 1208–1211 are ON is the DC voltage at node 1212 close to $V_{CC}$, balancing the opposite polarity DC source 1110 so that the diode 1106 is only slightly forward biased. The diode therefore presents high impedance to the AC source 1102, resulting in a high AC output voltage (logical ON) to the output signal line 1104.

Figure 13:
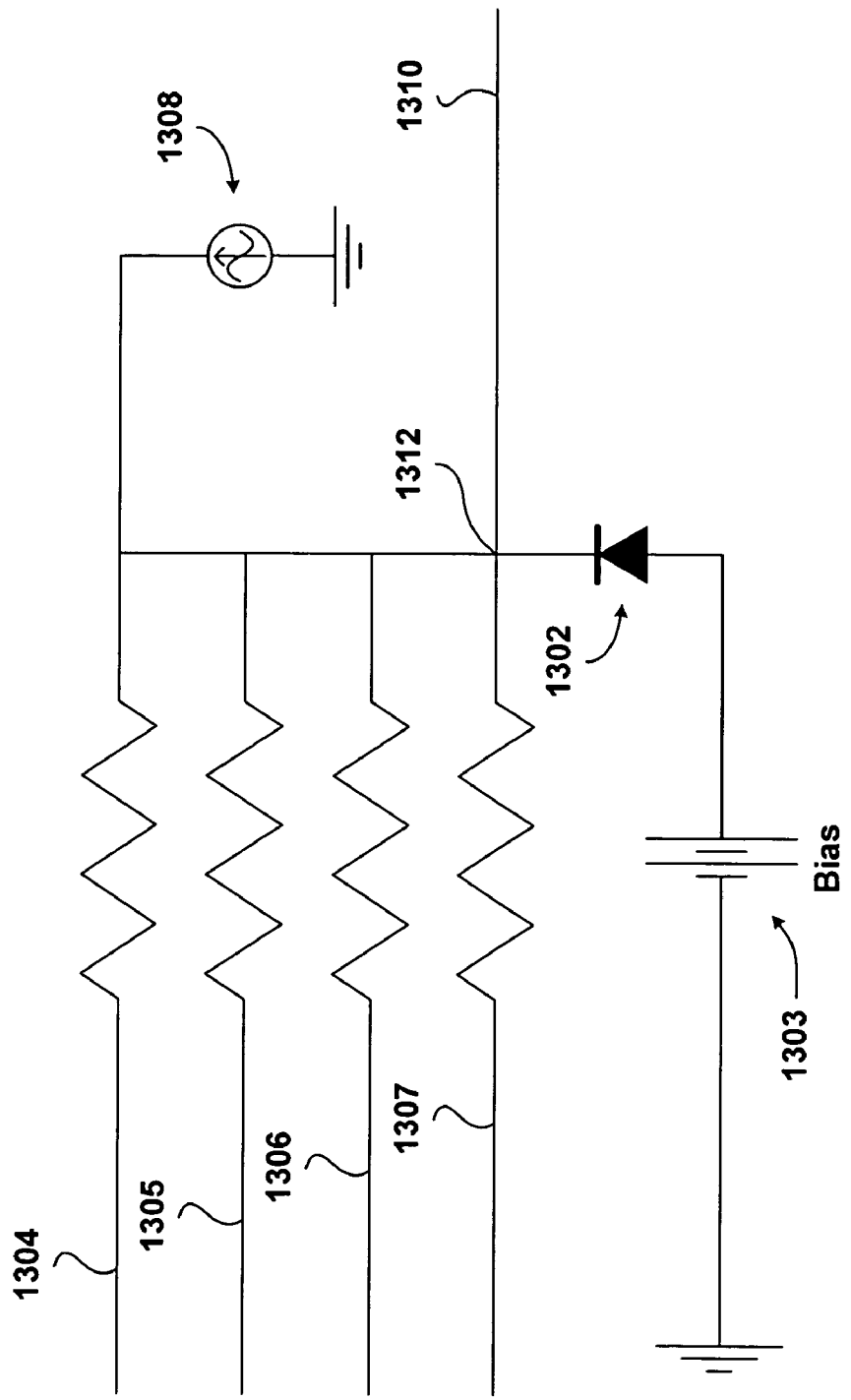
FIG. 13 shows an AC-enhanced, nanoscale logical OR gate that represents on embodiment of the present invention.

FIG. 13 shows an AC-enhanced, nanoscale logical OR gate that represents on embodiment of the present invention. In FIG. 13, the diode 1302 is only fully forward biased by the fully forward biasing bias source 1303 when all four input signals 1304–1307 are OFF. Otherwise, when any one or more of the input signal lines 1304–1307 are ON, with DC voltage $V_{cc}$, the voltage at node 1312 is larger, and in opposite polarity, to the bias voltage, and the diode is consequently not forward biased, and therefore presents high impedance to the AC source 1308. Therefore, the output signal line 1310 is ON when one or more of the input signal lines is ON, and is OFF when all four of the input signal lines are OFF.

Figure 14:
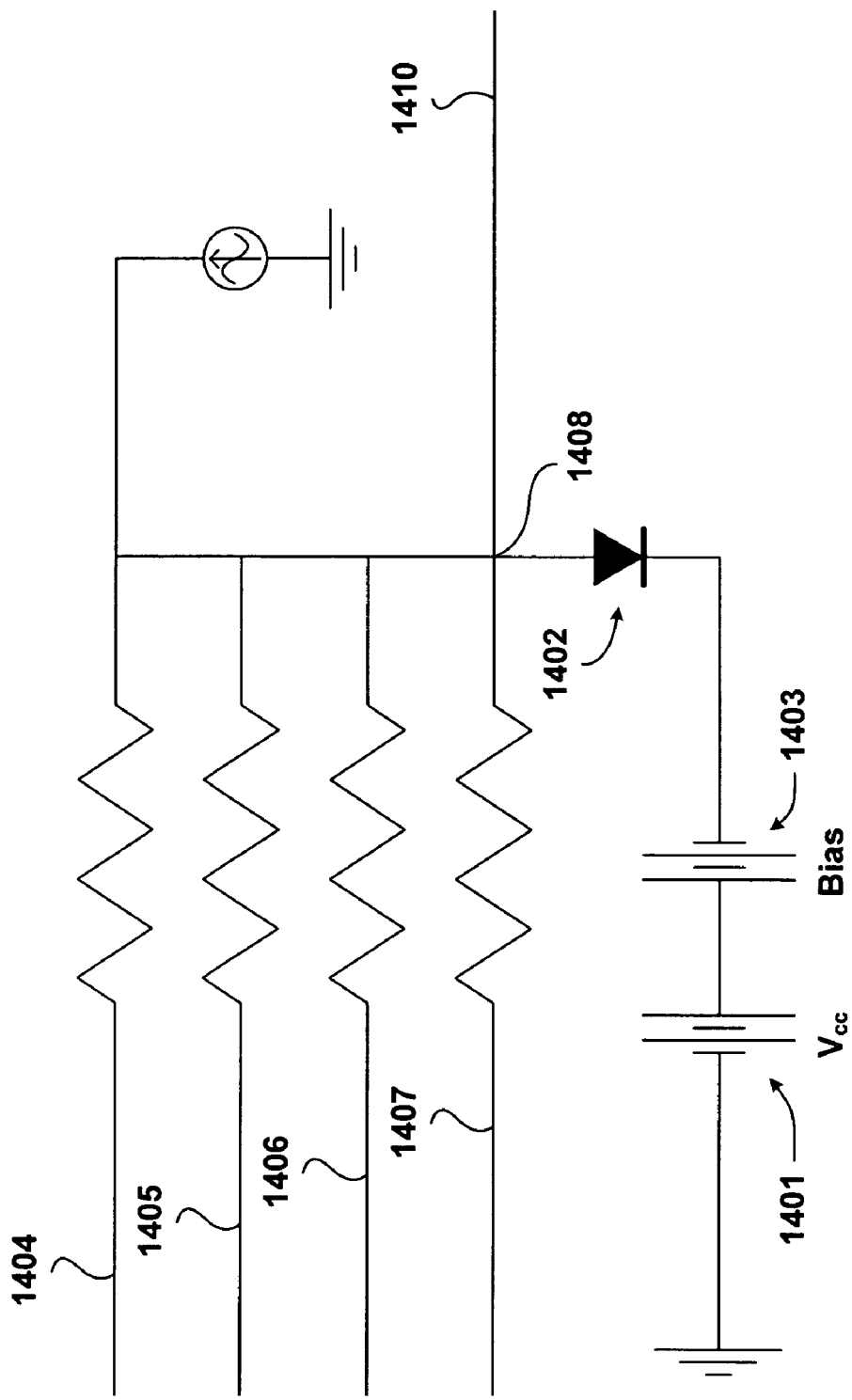
FIG. 14 illustrates an AC-enhanced, nanoscale NAND logic gate that represents one embodiment of the present invention.

FIG. 14 illustrates an AC-enhanced, nanoscale NAND logic gate that represents one embodiment of the present invention. In FIG. 14, the diode 1402 would be fully forward biased by the biasing DC voltage source 1403, but is reverse biased by the larger voltage $V_{cc}$ source 1401. When any one or more of the input signal lines 1404–1407 are OFF, the voltage at node 1408 is insufficient to forward bias the diode 1402. Therefore, only when all four input signal lines are ON is the output signal line 1410 OFF, while, when any one or more of the input signal lines 1404–1407 is OFF, the output signal line 1410 is ON.

Figure 15:
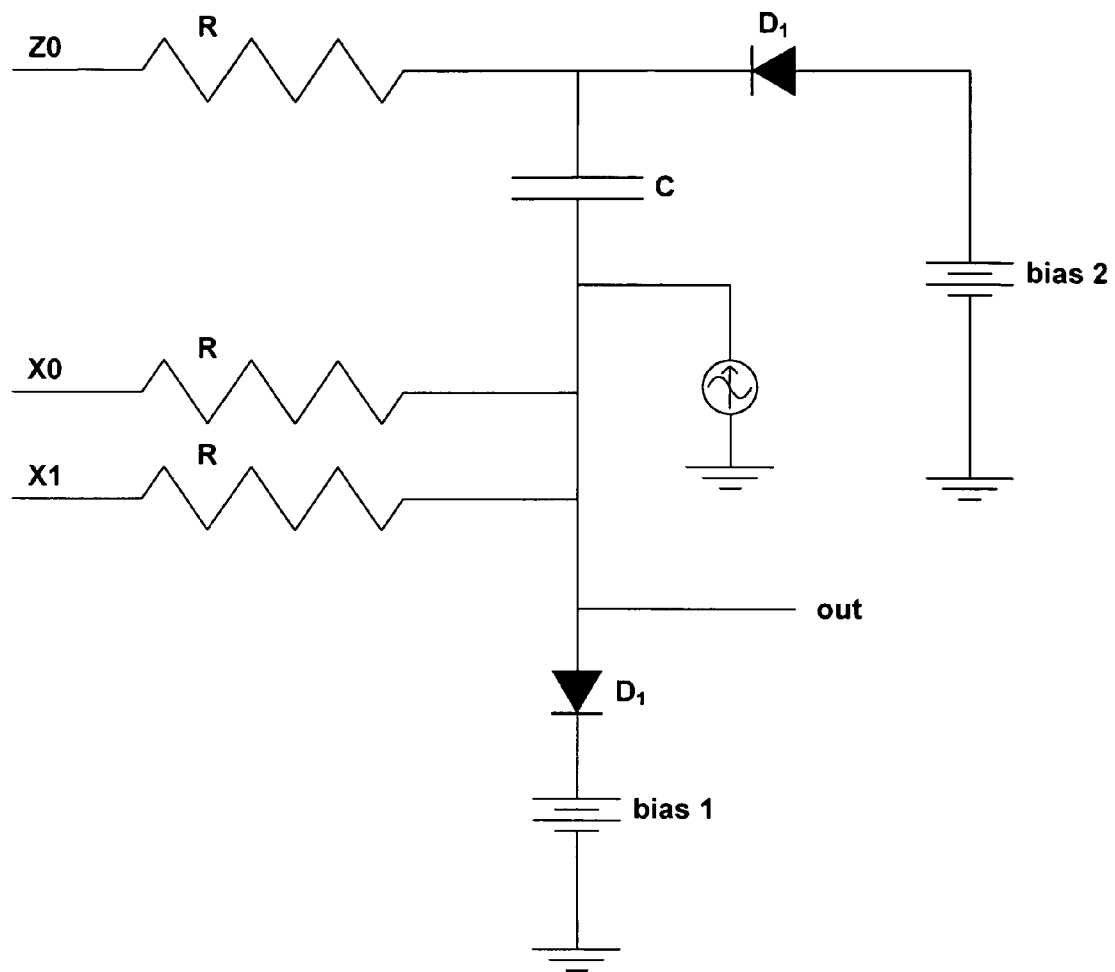
FIG. 15 shows an AC-enhanced, mixed-logic circuit that represents an embodiment of the present invention.

Although the present invention has been described in terms of a particular embodiment, it is not intended that the invention be limited to this embodiment. Modifications within the spirit of the invention will be apparent to those skilled in the art. For example, an almost limitless number of different logic circuits incorporate one of the logical-gate embodiments described above. For example, FIG. 15 shows an AC-enhanced mixed-logic circuit that produces an ON output signal when inputs X0 and X1 are OFF and input Z0 is ON. The AC-enhanced molecular logic-gate implementations incorporate only a single diode element, despite the number of input signal lines. A single-diode-nanoscale circuit can be manufactured with greater reliability, and correspondingly higher yield, then a multiple-diode-nanoscale circuit, as discussed above. Moreover, the single diode element may be a sub-micron diode manufactured using a different technology than the molecular-wire-implementation of the nanoscale logic gate. Additional configurations of logic circuits that produce AC-enhanced logic circuits are possible. In alternative embodiments, a transistor may be used to switch AC current to the output signal line, rather than a diode. Many other types of components and component configurations are possible that produce nanoscale logic gates with well separated AC logical signal states. Embodiments of the present invention may be employed in nanoscale and mixed nanoscale/microscale logic circuits, processors, programmable gate arrays, memories, and other types of electronic devices and circuits.

The foregoing description, for purposes of explanation, used specific nomenclature to provide a thorough understanding of the invention. However, it will be apparent to one skilled in the art that the specific details are not required in order to practice the invention. The foregoing descriptions of specific embodiments of the present invention are presented for purpose of illustration and description. They are not intended to be exhaustive or to limit the invention to the precise forms disclosed. Obviously many modifications and variations are possible in view of the above teachings. The embodiments are shown and described in order to best explain the principles of the invention and its practical applications, to thereby enable others skilled in the art to best utilize the invention and various embodiments with various modifications as are suited to the particular use contemplated. It is intended that the scope of the invention be defined by the following claims and their equivalents:

The invention claimed is:

1. A nanoscale logic gate comprising:
    an alternating-current source;
    two or more input signal lines connected through resistive elements to the alternating-current source and carrying direct-current logical states;
    a signal line connected to the alternating-current source and two or more input signal lines through a switch element that is either in a high-impedance state or a low-impedance state; and
    an output signal line that outputs an AC logical state.

2. The nanoscale logic gate, of claim 1 wherein the nanoscale logic gate outputs an AC signal representing a logical NOR of the DC logical states of the two or more input signal lines.

3. The nanoscale logic gate of claim 2 wherein the switch element is a diode-like element that is slightly forward biased and in a high-impedance state when all of the two or more input signal lines are in logical OFF DC states and is otherwise fully forward biased, in a low-impedance state, and passed both AC and DC current to ground.

4. The nanoscale logic gate of claim 1 wherein the nanoscale logic gate outputs an AC signal representing a logical AND of the DC logical states of the two or more input signal lines.

5. The nanoscale logic gate of claim 4 wherein the switch element is a diode-like element that is fully forward biased, in a low-impedance state, and passes DC current to output unless all of the two or more input signal lines are in logical ON DC states.

6. The nanoscale logic gate of claim 1 wherein the nanoscale logic gate outputs an AC signal representing a logical OR of the DC logical states of the two or more input signal lines.

7. The nanoscale logic gate of claim 6 wherein the switch element is a diode-like element that is fully forward biased, in a low-impedance state, and passes a biasing DC current to output only when all of the two or more input signal lines are in logical OFF DC states and otherwise not fully forward biased and in a high-impedance state.

8. The nanoscale logic gate of claim 1 wherein the nanoscale logic gate outputs an AC signal representing a logical NAND of the DC logical states of the two or more input signal lines.

9. The nanoscale logic gate of claim 1 wherein the switch element is a diode-like element that is fully forward biased, in a low-impedance state, and passes a small DC current to ground when all of the two or more input signal lines are in logical ON DC states, and is otherwise slightly forward biased or reverse biased and in a high-impedance state.

10. A naoscale logic circuit employing one or more nanoscale logic gates of claim 1.

11. A mixed nanoscale/microscale logic circuit employing one or more nanoscale logic gates of claim 1.

12. A method for producing, in a nanoscale logic gate, well-separated output logical states representing a logical operation on the logical states of two or more input signal lines having direct-current-based logical states, the method comprising:
  including in the logical gate an alternating-current source;
  interconnecting the alternating-current source to the two or more input signal lines through resistor-like elements;
  interconnecting the alternating current source to a signal line through a switch element that is in either a high impedance or a low impedance state, depending on the direct-current-based logical states of the input signal lines;
  and interconnecting an output signal line to the alternating-current source, two or more input signal lines through resistor-like elements, and switch element so that the output signal line carries a logical AC output signal close to the alternating-current source or close to 0.

13. The method of claim 12 wherein the nanoscale logic gate outputs an AC signal representing a logical NOR of the DC logical states of the two or more input signal lines.

14. The method of claim 13 wherein the switch element is a diode-like element that is slightly forward biased and in a high-impedance state when all of the two or more input signal lines are in logical OFF DC states and is otherwise fully forward biased, in a low-impedance state, and passed both AC and DC current to ground.

15. The method of claim 12 wherein the nanoscale logic gate outputs an AC signal representing a logical AND of the DC logical states of the two or more input signal lines.

16. The method of claim 15 wherein the switch element is a diode-like element that is fully forward biased, in a low-impedance state, and passes DC current to output unless all of the two or more input signal lines are in logical ON DC states.

17. The method of claim 12 wherein the nanoscale logic gate outputs an AC signal representing a logical OR of the DC logical states of the two or more input signal lines.

18. The method of claim 17 wherein the switch element is a diode-like element that is fully forward biased, in a low-impedance state, and passes a biasing DC current to output only when all of the two or more input signal lines are in logical OFF DC states and otherwise not fully forward biased and in a high-impedance state.

19. The method of claim 12 wherein the nanoscale logic gate outputs an AC signal representing a logical NAND of the DC logical states of the two or more input signal lines.

20. The method of claim 19 wherein the switch element is a diode-like element that is fully forward biased, in a low-impedance state, and passes a small DC current to ground when all of the two or more input signal lines are in logical ON DC states, and is otherwise slightly forward biased or reverse biased and in a high-impedance state.

* * * * *

UNITED STATES PATENT AND TRADEMARK OFFICE
CERTIFICATE OF CORRECTION

PATENT NO. : 7,117,454 B2  Page 1 of 1
APPLICATION NO. : 10/693150
DATED : October 3, 2006
INVENTOR(S) : Richard A. Baugh et al.

It is certified that error appears in the above-identified patent and that said Letters Patent is hereby corrected as shown below:

In column 9, line 7, delete "biaed" and insert -- biased --, therefor.

In column 10, line 42, in Claim 2, after "gate" delete ",".

In column 11, line 14, in Claim 10, delete "naoscale" and insert -- nanoscale --, therefor.

Signed and Sealed this

Sixth Day of April, 2010

David J. Kappos
*Director of the United States Patent and Trademark Office*